United States Patent
Saen et al.

(10) Patent No.: US 8,184,463 B2
(45) Date of Patent: May 22, 2012

(54) SEMICONDUCTOR APPARATUS

(75) Inventors: Makoto Saen, Kodaira (JP); Kenichi Osada, Tokyo (JP); Masanao Yamaoka, Kodaira (JP); Tomonori Sekiguchi, Tama (JP)

(73) Assignee: Hitachi, Ltd., Tokyo (JP)

( * ) Notice: Subject to any disclaimer, the term of this patent is extended or adjusted under 35 U.S.C. 154(b) by 269 days.

(21) Appl. No.: 12/636,758

(22) Filed: Dec. 13, 2009

(65) Prior Publication Data

US 2010/0155921 A1    Jun. 24, 2010

(30) Foreign Application Priority Data

Dec. 18, 2008   (JP) ................................ 2008-322224

(51) Int. Cl.
G11C 5/06      (2006.01)
G11C 7/00      (2006.01)
H01L 23/48     (2006.01)
H01L 23/52     (2006.01)

(52) U.S. Cl. ........................ 365/63; 365/191; 257/777

(58) Field of Classification Search .................. 365/63; 257/777

See application file for complete search history.

(56) References Cited

U.S. PATENT DOCUMENTS

| 2003/0052399 A1* | 3/2003 | Shibata ............... 257/686 |
| 2005/0078519 A1* | 4/2005 | Shiga ................ 365/185.17 |
| 2007/0001294 A1* | 1/2007 | Shen .................. 257/723 |
| 2007/0132085 A1  | 6/2007 | Shibata et al. |
| 2011/0133309 A1* | 6/2011 | Kuroda ............... 257/531 |

FOREIGN PATENT DOCUMENTS

JP    2007-158237 A    6/2007

* cited by examiner

*Primary Examiner* — Ly D Pham
(74) *Attorney, Agent, or Firm* — Miles and Stockbridge P.C.

(57) ABSTRACT

The need for mediation operation is eliminated by adoption of a connection topology in which a circuit for executing one transmission (TR__00T), and a circuit for executing a plurality of receptions (TR__10R, TR__20R, TR__30R) are connected to one penetration-electrode group (for example, TSVGL__0). In order to implement the connection topology even in the case of piling up a plurality of LSIs one after another, in particular, a programmable memory element for designating respective penetration-electrode ports for use in transmit, or for us in receive, and address allocation of the respective penetration-electrode ports is mounted in stacked LSIs.

16 Claims, 12 Drawing Sheets

FIG. 2

| LINE NO. | ACCESS REQUEST SOURCE | ACCESS REQUEST RECEIVER | ACCESS ROUTE |
|---|---|---|---|
| 1 | FUNC_0 | FUNC_1 | TR_00T > TSVGL_0 > TR_10R > FUNC_1 > TR_11T > TSVGL_1 > TR_01R |
| 2 | FUNC_0 | FUNC_2 | TR_00T > TSVGL_0 > TR_20R > FUNC_2 > TR_22T > TSVGL_2 > TR_02R |
| 3 | FUNC_0 | FUNC_3 | TR_00T > TSVGL_0 > TR_30R > FUNC_3 > TR_33T > TSVGL_3 > TR_03R |
| 4 | FUNC_0 | MEM_40 | T_04T > TSVGM_0 > R_44R > MEM40 > T_45T > TSVGM_1 > R_05R |
| 5 | FUNC_0 | MEM_50 | T_04T > TSVGM_0 > R_54R > MEM50 > T_55T > TSVGM_1 > R_05R |
| 6 | FUNC_0 | MEM_41 | TR_00T > TSVGL_0 > TR_10R > FUNC_1 > T_16T > TSVGM_2 > R_46R > MEM41 > T_47T > TSVGM_3 > R_17R > FUNC_1 > TR_11T > TSVGL_1 > TR_01R |
| 7 | FUNC_0 | MEM_51 | TR_00T > TSVGL_0 > TR_10R > FUNC_1 > T_16T > TSVGM_2 > R_56R > MEM51 > T_57T > TSVGM_3 > R_17R > FUNC_1 > TR_11T > TSVGL_1 > TR_01R |
| ... | ... | ... | ... |
| 8 | FUNC_3 | FUNC_0 | TR_33T > TSVGL_3 > TR_03R > FUNC_0 > TR_00T > TSVGL_0 > TR_30R |
| 9 | FUNC_3 | FUNC_1 | TR_33T > TSVGL_3 > TR_13R > FUNC_1 > TR_11T > TSVGL_1 > TR_31R |
| 10 | FUNC_3 | FUNC_2 | TR_33T > TSVGL_3 > TR_23R > FUNC_2 > TR_22T > TSVGL_2 > TR_32R |
| 11 | FUNC_3 | MEM_40 | TR_33T > TSVGL_3 > TR_03R > FUNC_0 > T_04T > TSVGM_0 > R_44R > MEM40 > T_45T > TSVGM_1 > R_05R > FUNC_0 > TR_00T > TSVGL_0 > TR_30R |
| 12 | FUNC_3 | MEM_50 | TR_33T > TSVGL_3 > TR_03R > FUNC_0 > T_04T > TSVGM_0 > R_54R > MEM50 > T_55T > TSVGM_1 > R_05R > FUNC_0 > TR_00T > TSVGL_0 > TR_30R |
| 13 | FUNC_3 | MEM_41 | TR_33T > TSVGL_3 > TR_13R > FUNC_1 > T_16T > TSVGM_2 > R_46R > MEM41 > T_47T > TSVGM_3 > R_17R > FUNC_1 > TR_11T > TSVGL_1 > TR_31R |
| 14 | FUNC_3 | MEM_51 | TR_33T > TSVGL_3 > TR_13R > FUNC_1 > T_16T > TSVGM_2 > R_56R > MEM51 > T_57T > TSVGM_3 > R_17R > FUNC_1 > TR_11T > TSVGL_1 > TR_31R |

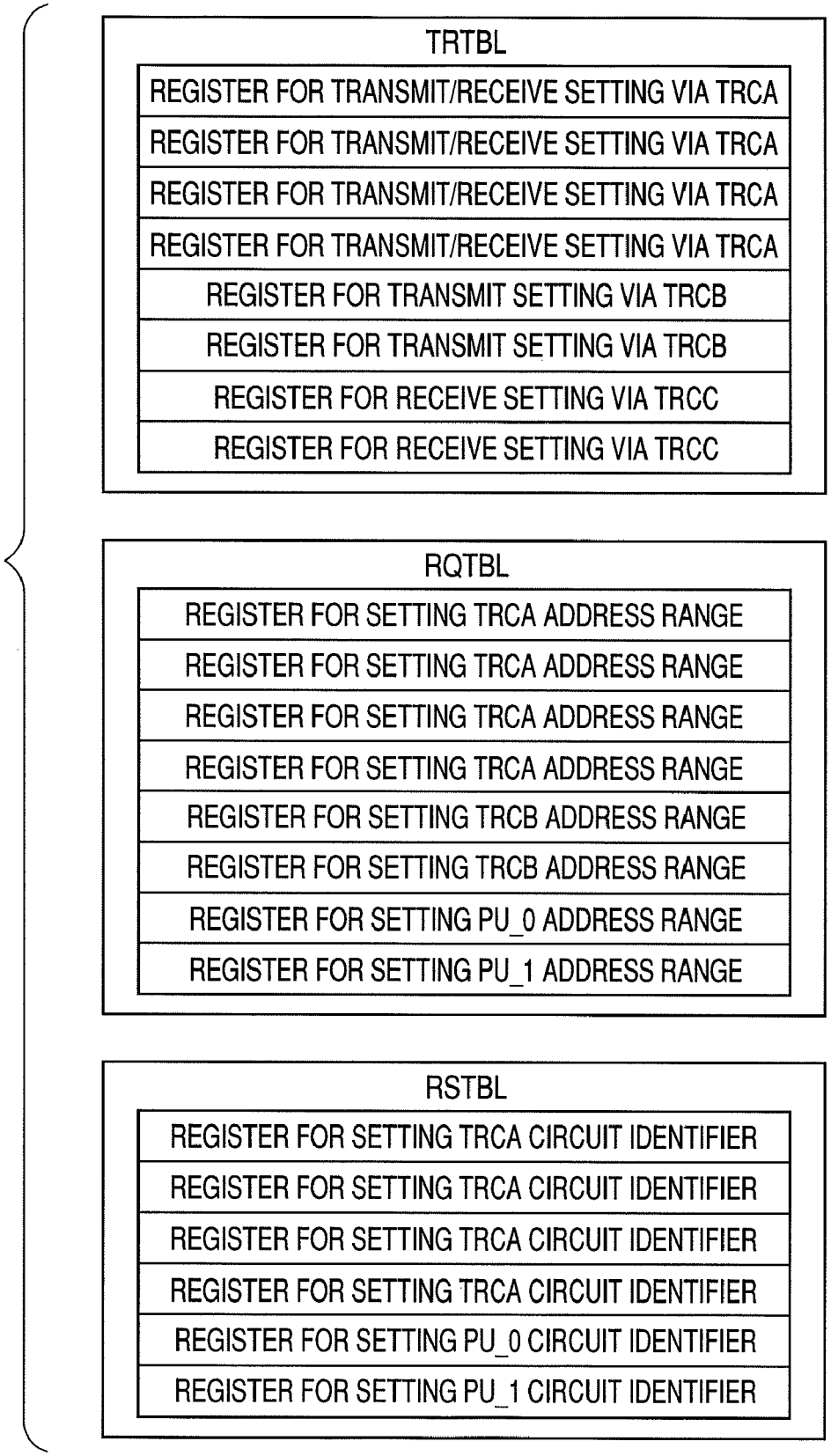

TRTBL
- REGISTER FOR TRANSMIT/RECEIVE SETTING VIA TRCA
- REGISTER FOR TRANSMIT/RECEIVE SETTING VIA TRCA
- REGISTER FOR TRANSMIT/RECEIVE SETTING VIA TRCA
- REGISTER FOR TRANSMIT/RECEIVE SETTING VIA TRCA
- REGISTER FOR TRANSMIT SETTING VIA TRCB
- REGISTER FOR TRANSMIT SETTING VIA TRCB
- REGISTER FOR RECEIVE SETTING VIA TRCC
- REGISTER FOR RECEIVE SETTING VIA TRCC

RQTBL
- REGISTER FOR SETTING TRCA ADDRESS RANGE
- REGISTER FOR SETTING TRCA ADDRESS RANGE
- REGISTER FOR SETTING TRCA ADDRESS RANGE
- REGISTER FOR SETTING TRCA ADDRESS RANGE
- REGISTER FOR SETTING TRCB ADDRESS RANGE
- REGISTER FOR SETTING TRCB ADDRESS RANGE
- REGISTER FOR SETTING PU_0 ADDRESS RANGE
- REGISTER FOR SETTING PU_1 ADDRESS RANGE

RSTBL
- REGISTER FOR SETTING TRCA CIRCUIT IDENTIFIER
- REGISTER FOR SETTING TRCA CIRCUIT IDENTIFIER
- REGISTER FOR SETTING TRCA CIRCUIT IDENTIFIER
- REGISTER FOR SETTING TRCA CIRCUIT IDENTIFIER
- REGISTER FOR SETTING PU_0 CIRCUIT IDENTIFIER
- REGISTER FOR SETTING PU_1 CIRCUIT IDENTIFIER

T
(T_04T, T_14F, T_24F, T_34F, T_45T, T_55T,
T_06F, T_16T, T_26F, T_36F, T_47T, T_57T)

SEMICONDUCTOR APPARATUS

CLAIM OF PRIORITY

The present application claims priority from Japanese patent application JP 2008-322224 filed on Dec. 18, 2008, the content of which is hereby incorporated by reference into this application.

FIELD OF THE INVENTION

The present invention relates to a semiconductor apparatus, and more specifically, to a communication system of a semiconductor apparatus with stacked LSIs (Large Scale Integration) mounted therein.

BACKGROUND OF THE INVENTION

With an LSI, as further progress has been made in microfabrication technology, so a greater number of transistors have been integrated on one chip, having thereby attempted to achieve enhancement in performance. However, due to limitations to miniaturization, an increase in cost of utilizing a leading-edge process, and so forth, it will not necessarily provide the optimal solution to a problem to promote further integration of the transistors on one chip as in the past. Accordingly, integration in three-dimensional directions, implemented by piling up a plurality of LSIs, will become a technology that is highly hoped for.

In order to obtain a desired performance of stacked LSIs, communication function among LSIs piled up one after another is important. One of favorite solutions to a problem of the communication system for the stacked LSIs is multiple-pin 3D communication by use of a silicon penetration-electrode. Thus, in JP-A-2007-158237, use is made of a bus-connection system whereby circuits on a plurality of LSIs have authority for outputting to a specific penetration-electrode, as a system for making connection among the stacked LSIs through the intermediary of the silicon penetration-electrode.

SUMMARY OF THE INVENTION

Use of, for example, the bus-connection system shown in JP-A-2007-158237 is at an advantage in that a multitude of LSIs can share a penetration-electrode. On the other hand, with this system, if signals are outputted concurrently from a plurality of LSIs, correct communication cannot be established, so that in such a case, there will be the need for mediation in right of use by the penetration-electrode, whereby concurrent outputs are rendered one output. JP-A-2007-158237 is concerned with stacked memories, and all the stacked memories are activated against a memory access-request from outside (because an access-request source is one), so that mediation control is unnecessary, and the system described in JP-A-2007-158237 is therefore suitable.

However, in the case where logic LSIs with independently operating processor, and so forth, mounted thereon, respectively, are piled up one after another, there will be many occasions when the system wherein the plurality of the LSIs each have an authority for outputting to one penetration-electrode is not optimal. This is because the respective LSIs gain access by use of the penetration-electrode at optional timing, and therefore, mediation for acquiring the right of use by the penetration-electrode before outputting to the penetration-electrode will become indispensable, so that an increase in overhead time will occur due to the mediation, resulting in an increase in latency for communication, and deterioration in communication throughput. Further, the fact that the respective LSIs normally operate according to clocks out of sync with each other is one of the causes for the increase in the overhead time.

Ethernet (registered trade mark) for use in Internet, and so forth can be cited as an example of systems wherein a plurality of LSIs output to one common interconnection. Techniques for use in this case include a system wherein a specific LSI senses information on a common interconnection when attempting to output thereto, and if the common interconnection is in use, the LSI waits for random time before attempting to output again. With this system, utilization of the common interconnection is not so high, and communication frequency is not so high either (for example, 1 GHz or less), so that the system is effective because the number of interconnections can be reduced if an increase in transfer latency is permissible. However, in the case of communication between LSIs by use of the penetration-electrode, this system is unsuitable because a utilization ratio is high, communication frequency is often in excess of GHz, and very low transfer latency is required. Furthermore, use of the penetration-electrodes has a feature in that many interconnections can be used, so that constraints on the number of interconnections are not severe, and there is difficulty in enjoying the advantage.

With stacked LSIs incorporating logic LSIs with, independently operating processor, and so forth, mounted thereon, respectively, there are the needs for a system for high-frequency communication high in throughput, and low in transfer latency. The present invention has been developed in the light of the problems described. The above and other objects, and novel features of the present invention will be apparent from the following detailed description of the preferred embodiments of the invention in conjunction with the accompanying drawings.

Overview of a representative embodiment of the invention, disclosed under the present application, is briefly described as follows. With the adoption of a connection topology wherein a circuit for executing one transmission, and a circuit for executing a plurality of receptions are connected to one penetration-electrode, high-throughput transfer is enabled while transfer latency is minimized. In order to implement the connection topology even in the case of piling up a plurality of LSIs one after another, in particular, a programmable memory element for designating respective penetration-electrode ports for use in transmit, or for us in receive, and designating address-routing for the respective penetration-electrode ports is mounted in stacked LSIs.

To briefly describe an advantageous effect of the representative embodiment of the invention, disclosed under the present application, it is possible to establish communication low in latency, and high in throughput between respective LSIs of the stacked LSIs.

BRIEF DESCRIPTION OF THE DRAWINGS

FIG. 2 is a view showing communication paths between LSIs piled up one after another in FIG. 1;

FIG. 8 is a view showing detailed contents of registers for various setting, in FIG. 4, by way of example;

DETAILED DESCRIPTION OF THE PREFERRED EMBODIMENTS

Figure 1:
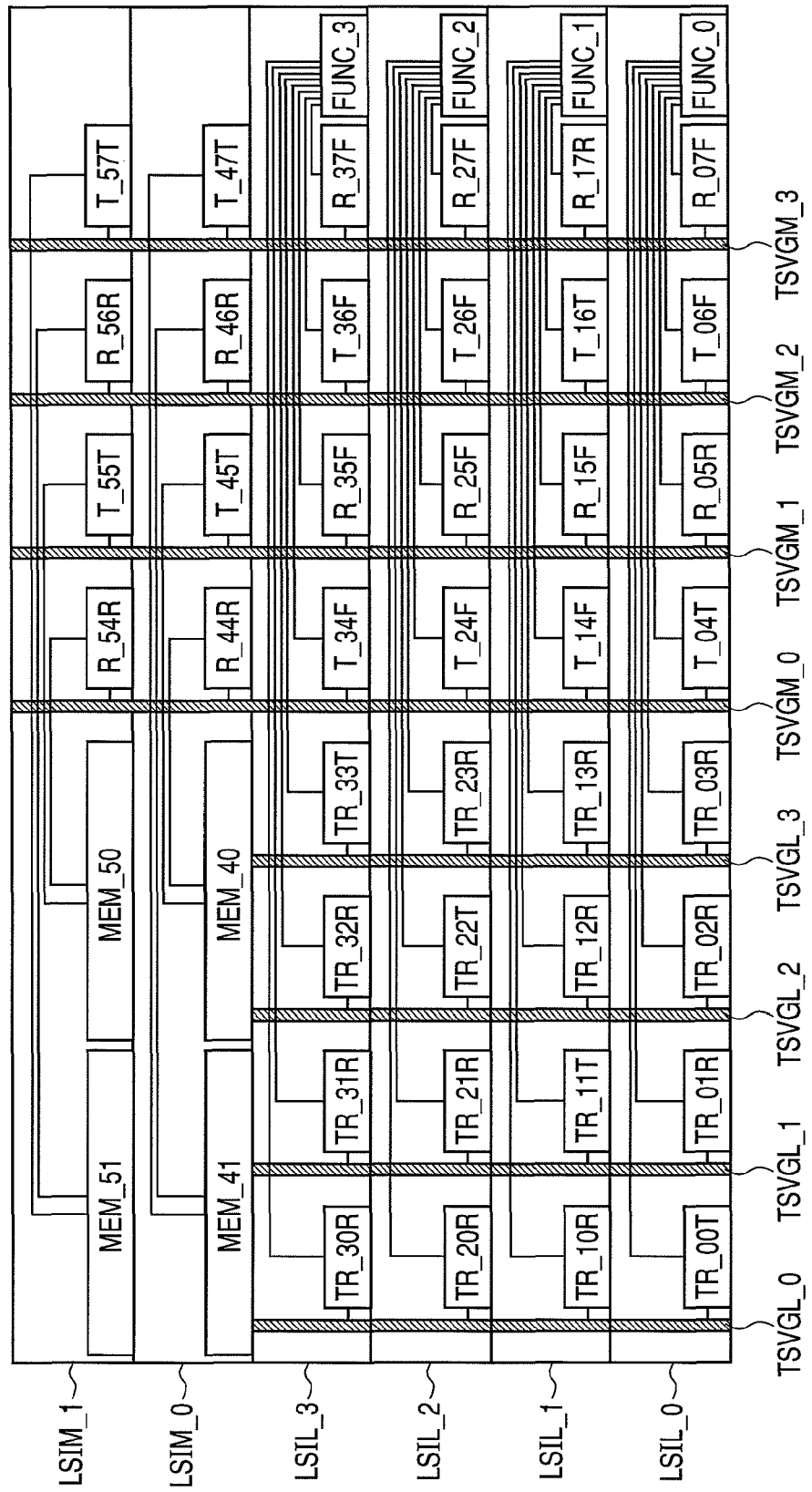
FIG. 1 is a schematic representation showing one example of a configuration of a semiconductor apparatus according to a first embodiment of the invention.

It is to be understood that the number of elements, and so forth (including the number of pieces, numerical values, quantities, scopes, and so forth), as referred to in the following embodiments of the invention, be not limited to a specific number referred to, and may be not less than the specific number, or not more than the specific number unless, for example, specifically and explicitly limited thereto, or obviously limited thereto in theory. Further, it is obvious that constituent elements (including element steps, and so forth) referred to in the following embodiments of the invention are not necessarily essential unless, for example, explicitly described as essential, or obviously deemed essential in theory. Similarly, it is to be understood that respective shapes of the constituent elements, and so forth, positional relationship thereof, and so forth, as referred to in the following embodiments of the invention, be meant to include shapes, and so forth, effectively approximate to, or similar to the shapes of the constituent elements, and so forth, unless, for example, specifically and explicitly described otherwise, or obviously deemed otherwise in theory. The same applies to the numerical values, and scopes, described as above.

Further, there is no particular limitation to a circuit element as a constituent of respective function blocks in the embodiment of the invention, and the circuit element is formed on a semiconductor substrate such as single crystal silicon by use of the integrated circuit technology for the known CMOS (Complementary MOS transistor), and so forth. The embodiments of the invention will be described in detail hereinafter with reference to the accompanying drawings. In all figures for use in describing respective embodiments of the invention, identical members are in principle denoted by like reference numerals, omitting repeated description thereof.

First Embodiment

FIG. 1 is a schematic representation showing one example of a configuration of a semiconductor apparatus according to a first embodiment of the invention. The semiconductor apparatus in FIG. 1 is in the form of stacked LSIs composed of four layers of logic LSIs (LSIL_0, LSIL_1, LSIL_2, LSIL_3), and two layers of memory LSIs (LSIM_0, LSIM_1), piled up one another, wherein connection between the respective LSIs is implemented with a penetration-electrode. The four logic LSIs each are, for example, an identical LSI, on which a functional unit such as CPU (Central Processing Unit), and so forth is mounted. The two memory LSIs each are also, for example, an identical LSI, on which a memory array, such as DRAM, and so forth, is mounted. TSVGL_0, TSVGL_1, TSVGL_2, and TSVGL_3 each denote a penetration-electrode group for establishing communication between the respective logic LSIs while TSVGM_0, and TSVGM_1 each denote a penetration-electrode group for establishing communication between the logic LSI, and the memory LSI.

In the logic LSIs, TR_00T, TR_01R, TR_02R, TR_03R, TR_10R, TR_11T, TR_12R, TR_13R, TR_20R, TR_21R, TR_22T, TR_23R, TR_30R, TR_31R, TR_32R, TR_33T each denote a penetration electrode transmit/receive circuit (TR) connected to the penetration-electrode group for interconnecting between the respective logic LSIs. Those penetration-electrode transmit/receive circuits each are capable of designating whether the circuit is to be used as a transmit-circuit or a receive-circuit according to an electric signal. In FIG. 1, TR_00T, TR_11T, TR_22T, and TR_33T each are designated as the transmit-circuit, and the rest are each designated as the receive-circuit. As a result of adoption of a configuration wherein transmit/receive can be designated after manufacture of LSIs as above, those LSIs can be rendered identical to each other.

Further, among the logic LSIs, T_04T, T_06F, T_14F, T_16T, T_24F, T_26F, T_34F, and T_36F each denote a penetration-electrode transmit-circuit for issuing a memory access right to respective penetration-electrode groups, interconnecting between the logic LSIs, and the memory LSIs, and those penetration-electrode transmit-circuits each are capable of designating whether or not transmission is to be executed according to an electric signal. In FIG. 1, T_04T, and T_16T are set so as to transmit a signal while T_06F, T_14F, T_24F, T_26F, T_34F, and T_36F each are set so as not to transmit/receive a signal. Further, R_05R, R_07F, R_15F, R_17R, R_25F, R_27F, R_35F, and R_37F each denote a penetration-electrode receive-circuit for receiving a memory access result from the respective penetration-electrode groups, interconnecting between the respective logic LSIs, and the respective memory LSIs, and those penetration-electrode receive-circuits each is capable of designating whether or not reception by an electric signal is to be executed according to the electric signal. In FIG. 1, R_05R, and R_17R are set so as to receive a signal, and the rest are set so as not to receive a signal.

Meanwhile, in the memory LSIs, R_44R, R_46R, R_54R, and R_56R each denote a penetration-electrode receive-circuit for receiving the memory access right from the respective penetration-electrode groups interconnecting between the respective logic LSIs, and the respective memory LSIs. Further, T_45T, T_47T, T_55T, and T_57T each denote a penetration-electrode transmit-circuit for transmitting the memory access result to the respective penetration-electrode groups interconnecting between the respective logic LSIs, and the respective memory LSIs. Further, in the logic LSIs, FUNC_0, FUNC_1, FUNC_2, and FUNC_3 each denote a logic circuit including a functional unit such as CPU, and so forth while in the memory LSIs, MEM_40, MEM_41, MEM_50, and MEM_51 each denote a memory block including a memory array.

Communication between the stacked LSIs in FIG. 1 is established through the intermediary of the respective penetration-electrode groups. FIG. 2 shows paths through which communication is established between the LSIs in the circuit shown in FIG. 1. In FIG. 2, there are shown communication paths from FUNC_0, and FUNC_3, respectively, through the intermediary of the respective penetration-electrode groups by way of example. For example, in the case where a circuit in FUNC_0 of LSIL_0 makes a read-request to a circuit in FUNC_1 of LSIL_1, FUNC_0 issues the read-request, TR_00T transmits the read-request to the penetration-electrode group TSVGL_0, and TR_10R receives the read-request, transmitting the read-request to FUNC_1, whereupon FUNC_1 executes processing of the read-request, TR_11T transmits a response thereto to the penetration-electrode group TSVGL_1, TR_01R receives the response to thereby transmit the same to FUNC_0, whereupon FUNC_0 receives the read-request, completing read processing (line no. 1 in FIG. 2).

Further, to take another example, in the case where a circuit in FUNC_0 of LSIL_0 makes a read-request to MEM_40 of LSIM_0, FUNC_0 issues a read-request, T_04T transmits the read-request to the penetration-electrode group TSVGM_0, and R_44R receives the read-request, thereby transmitting the read-request to MEM_40, whereupon MEM_40 executes processing of the read-request, T_45T transmits a response thereto to the penetration-electrode group TSVGM_11, R_05R receives the response to thereby transmits the same to FUNC_0, whereupon FUNC_0 receives the read-request, completing read processing (line no. 4 in FIG. 2).

Still further, to take still another example, in the case where a circuit in FUNC_3 of LSIL_3 makes a read-request to MEM_51 of LSIM_3, FUNC_3 issues a read-request, TR_33T transmits the read-request to the penetration-electrode group TSVGL_3, and TR_13R receives the read-request, whereupon T_16T transmits the read-request to TSVGM_2 through the intermediary of FUNC_1, and R_56R receives the read-request to thereby transmit the same to MEM_51, whereupon MEM_51 executes processing of the read-request, T_57T transmits a response thereto to the penetration-electrode group TSVGM_3, and R_17R receives the response, whereupon TR_11T transmits the response to the penetration-electrode group TSVGL_1 through the intermediary of FUNC_1, and TR_31R receives the response, whereupon FUNC_3 receives the read-request, completing read processing (line no. 14 in FIG. 2).

If an alternate path can be set up, as is the case of line no. 14, this will enable communication between the respective logic LSIs, and the respective memory LSIs to be executed with the use of the penetration-electrode groups fewer in number even in the case where a plurality of the memory blocks are provided in one memory LSI. That is, if only one logic LSI can communicate with one memory block in the respective memory LSIs through the intermediary of one penetration-electrode group, this will enable a logic LSI not directly connected to communicate with the memory block through the intermediary of the one logic LSI. Assuming that two or more logic LSIs can communicate through the intermediary of the one penetration-electrode group, mediation as previously described is required, so that there arises the necessity of adding another penetration-electrode group, resulting in an increase in the number of the penetration-electrode groups.

With the embodiment shown in FIG. 1, a configuration is adopted wherein the circuit for executing one transmission, and the circuit for executing a plurality of receptions are connected to a certain penetration-electrode group for establishing connection between the logic LSIs. To take an example, setting is made such that only TR_00T transmits to the penetration-electrode group TSVGL_0 while TR_10R, TR_20R, and TR_30R each execute only reception without executing transmission. This setting is made according to a value of a memory element (TSVREG in FIG. 4) in LSI. The logic LSI includes an actively-operating circuit such as CPU, and so forth, and if a configuration is adopted, wherein one penetration-electrode group is shared by circuits executing a plurality of transmissions, the mediation in the right of use by the penetration-electrode is required before use of the penetration-electrode, as described in the paragraph under heading of SUMMARY OF THE INVENTION, thereby causing occurrence of overhead time between transfer packets. Clocks are normally out of sync with each other between stacked LSIs, and the overhead time is normally large and non-negligible. Accordingly, if use is made of a configuration wherein a circuit for executing one transmission, and a circuit for executing a plurality of receptions are connected to one penetration-electrode group, an advantage is gained in that the overhead time can be checked, and communication control will be simpler because there will be no need for the mediation with respect to the right of use.

Further, peer-to-peer connection whereby receive-circuits connected to one penetration-electrode group are unified can be contemplated, however, in the case of piling up identical chips, it is not possible to delete parasitic loads of receive-circuits physically out of use even if a peer-to-peer connection structure is adopted, so that an effect of higher speed cannot be gained. For this reason, one-to-multiple structure, that is, a structure having multiple receptions against one transmission is adopted in the embodiment of the invention, shown in FIG. 1. By so doing, transfer that is low in latency, and high in throughput is enabled by making effective use of penetration-electrode resources.

Meanwhile, with respect to the penetration-electrode groups for use in the memory LSI transmitting a response to the logic LSI, as well, it is obviously possible to adopt a configuration wherein only one penetration-electrode transmit-circuit is connected to one penetration-electrode group as previously described. However, adopted in this case is a configuration wherein the one penetration-electrode group is shared by the penetration-electrode transmit-circuits in the plurality of the memory LSIs by taking advantage of the fact that the memory LSIs each undergo a passive operation. T_55T, and T_45T each transmit to TSVGM_1, and T_47T, and T_57T each transmit to TSVGM_3. The reason why the penetration-electrode group is shared by the plurality of the penetration-electrode transmit-circuits in the memory LSIs is because the memory LSIs each receive a request from the logic LSI, and undergo a passive operation by reacting to the request, so that it is easy to control timing at which the plurality of LSIs transmit to the penetration-electrode group to thereby eliminate the overhead time described as above. Thus, adoption of the configuration wherein the plurality of the memory LSIs can be connected to the one penetration-electrode group is advantageous in that a memory capacity to be mounted can be easily varied by changing the number of stacked layers of a memory. A memory is a general-purpose component, having a required capacity that is variable according to its application, and therefore, flexibility of a memory capacity, variable according to a finished product, is regarded important from a standpoint of optimizing performance, and cost.

Figure 3:
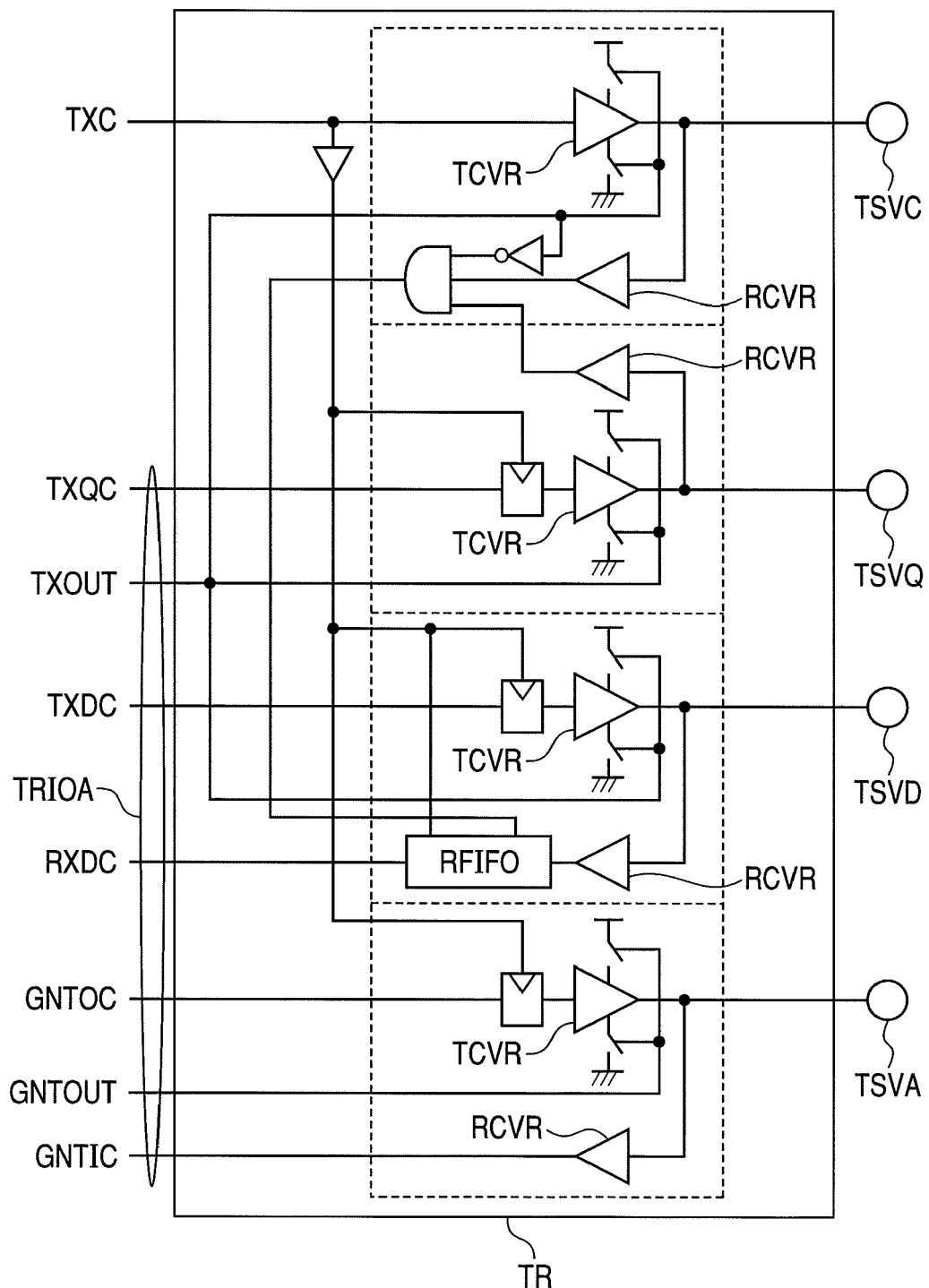
FIG. 3 is a view showing one example of a configuration of a penetration-electrode transmit/receive circuit in FIG. 1.

FIG. 3 shows a configuration of the penetration-electrode transmit/receive circuit (TR) in FIG. 1 by way of example. In FIG. 3, TCVR denotes a transceiver for executing transmission to a penetration-electrode group, RCVR a receiver circuit or executing reception from the penetration-electrode group, RFIFO a buffer circuit for storing reception information acquired from RCVR, and TSVC, TSVQ, TSVD, TSVA each denote a penetration-electrode port connected to the penetration-electrode group (TSVG) described in the foregoing. The penetration-electrode groups (TSVG) each are comprised of a plurality of penetration-electrodes, each of which is connected to those penetration-electrode ports. Further, TXC, TXOUT, TXQC, TXDC, RXDC, GNTOC, GNTOUT, and GNTIC each denote a signal line from inside of the LSI.

TSVD is the penetration-electrode port (signal) for information transmit/receive, and a transmit state thereof is designated by a TXOUT signal ('1' for transmit, '0' for receive). In FIG. 3, TSVD is shown as connected to one length of line, but is normally connected to a plurality of lines. When TR is set to a transmit state by TXOUT, information such as command, an address, data, and so forth, delivered from the signal line TXDC, is transmitted at timing designated by a trigger signal, such as clock, and so forth, inputted from the signal line TXC. When TR is set to a receive-state by TXOUT, information from TXVD is fetched to RFIFO at timing designated by a signal received from TSVC. RFIFO is a circuit for fetching the information from TXVD at timing designated by RSVC to thereby output the information to RXDC at timing designated by TXC, the circuit being comprised of memory circuits in a plurality of stages. Communication between different clock domains can be executed without data omission by the action of RFIFO.

TSVC is the penetration-electrode port (signal) for designating timing at which the information transmitted via TSVD is fetched at a receiving end, and is in a state where the transmit state thereof can be designated by the TXOUT signal, as is the case with TSVD. When TR is set to the transmit state by TXOUT, a signal generated on the basis of a signal delivered from the signal line. TXC is outputted from TSVC. When TR is not set to the transmit state by TXOUT, the signal received from TSVC is outputted to RFIFO. Examples of signals transmitted through TSVC include a transmit clock and so forth.

TSVQ is the penetration-electrode port (signal) for selecting a receive-circuit for fetching the information transmitted via TSVD. In FIG. 3, TSVQ is shown for connection to one length of line for brevity, but TSVQ is actually prepared for connection to each of lines in numbers corresponding to (the number of receive-circuits connected to target penetration-electrode groups in FIG. 1, respectively, minus 1). This signal is a signal outputted by a circuit set to a transmit-state to be thereby inputted to a circuit set to a receive-state. When TSVQ is asserted, the circuit set to the receive-state fetches the information acquired via TSVD to RFIFO at timing designated by TSVC. On the contrary, when this signal is not asserted, the information via TSVD is not fetched. With a configuration according to the present embodiment of the invention, a plurality of the receive-circuits are connected to one penetration-electrode group, as shown in FIG. 1, this signal designating a receive-circuit will be beneficial. Without TSVQ, all the receive-circuits need to fetch the information via TSVD once to thereby decode the information, determining on whether or not the information is necessary, which will lead to an increase in circuit scale of the receive-circuits, and an increase in power consumption for communication.

TSVA is the penetration-electrode port (signal) showing whether or not the LSI at a receiving end can receive the information transmitted via TSVD. This signal is a signal outputted by the circuit set to the receive state to be thereby inputted to the circuit set to the transmit state. In FIG. 3, TSVA is shown for connection to one length of line for brevity, but TSVA is actually prepared for connection to each of lines in numbers more than the number of receive-circuits connected to target penetration-electrode groups in FIG. 1, respectively, and each of the penetration-electrode transmit/receive circuits that has been set to the receive state occupies TSVA. GNTOUT represents a signal for designating transmit/receive for TSVA. When TSVA is set to the receive state by GNTOUT, information delivered from GNTOC, indicating a receive-state is transmitted to TSVA. When TSVA is set to the receive state, a signal received from TSVA, indicating the receive state, is outputted to GNTIC.

With the present embodiment of the invention, clocks are not synchronized between the stacked LSIs. Clock synchronization between the stacked LSIs is, in theory, possible, however, it will be difficult to realize enhancement in clock frequency. For this reason, a circuit for transmitting information to the penetration-electrode group outputs a timing signal for fetching the information on TSVD in the receive-circuit to TSVC, in parallel with information transmitted via TSVD, thereby establishing communication between the LSIs with clocks out of sync with each other.

Figure 10:
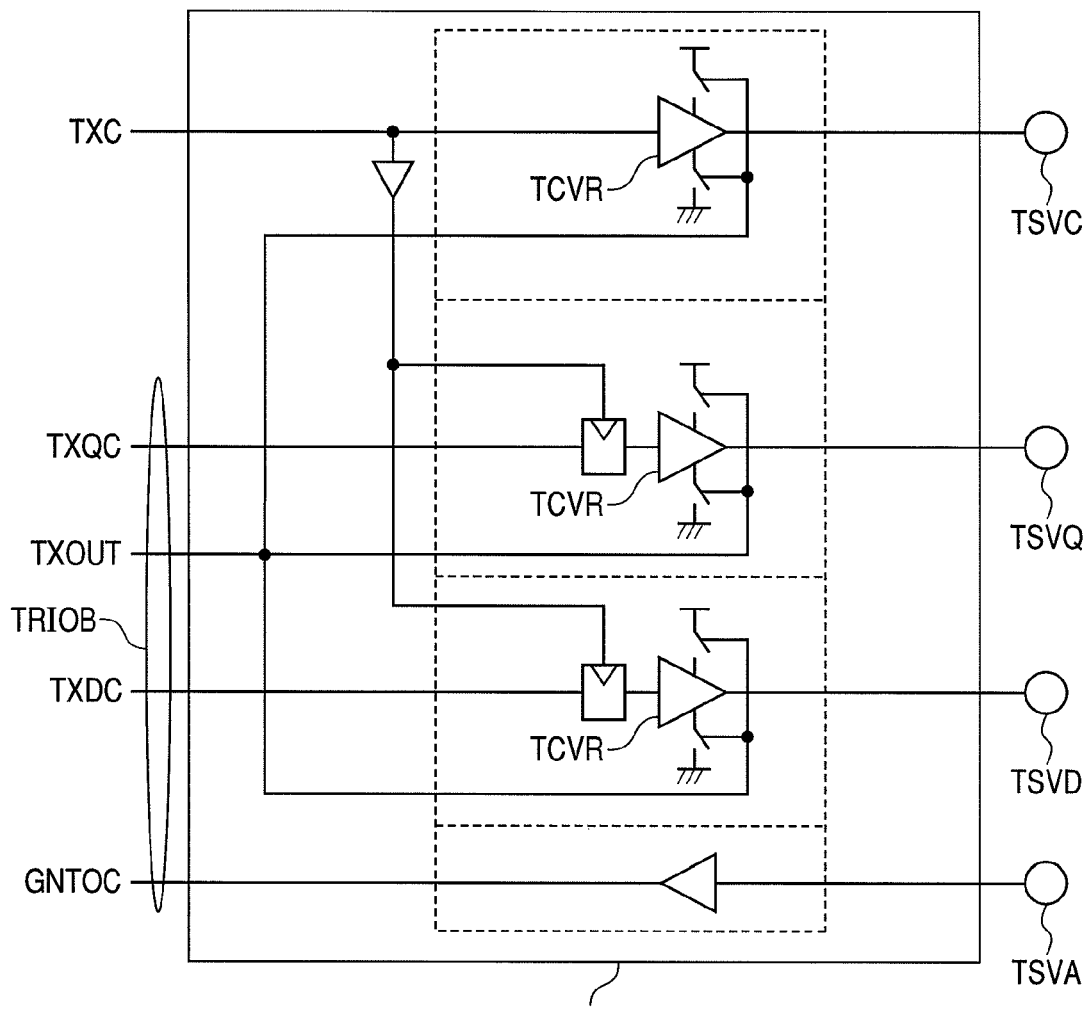
FIG. 10 is a view showing a configuration of a penetration-electrode transmit-circuit shown in FIG. 1 byway of example.

FIG. 10 is a view showing a configuration of the penetration-electrode transmit-circuit (T) shown in FIG. 1 by way of example. FIG. 10 shows the configuration of the penetration-electrode transmit/receive circuit (TR) shown in the FIG. 3, after removal of a signal-receive portion thereof. TSVD is the penetration-electrode port for outputting the information such as a command, an address, data, and so forth, delivered from the signal line TXDC, the information being outputted to TSVD at the timing designated by the trigger signal, such as clock, and so forth, inputted from the signal line TXC. TSVC is the penetration-electrode port for transmitting the timing at which the information is fetched in a receive-circuit, and the signal generated on the basis of the signal delivered from the signal line TXC is outputted from TSVC. TSVQ is the penetration-electrode port for selecting the receive-circuit for fetching the information transmitted via TSVD, and a signal inputted from the signal line TXQC is outputted thereto at timing designated by the trigger signal, such as clock, and so forth. TSVA is the penetration-electrode port (signal) showing whether or not the LSI at the receiving end can receive the information transmitted via TSVD. Since the circuit in FIG. 10 is a transmit-circuit, the circuit receives a signal from TSVA. Further, TSVD is not necessarily required. When the transmit-circuit in FIG. 10 execute transmit, TXOUT is asserted (the signal is turned '1') only at transmit-timing. Further, in the case of setting where transmit is not executed (that is, in the cases of T_06F, and so forth, in FIG. 1), TXOUT is fixed at '0' all the time.

Figure 11:
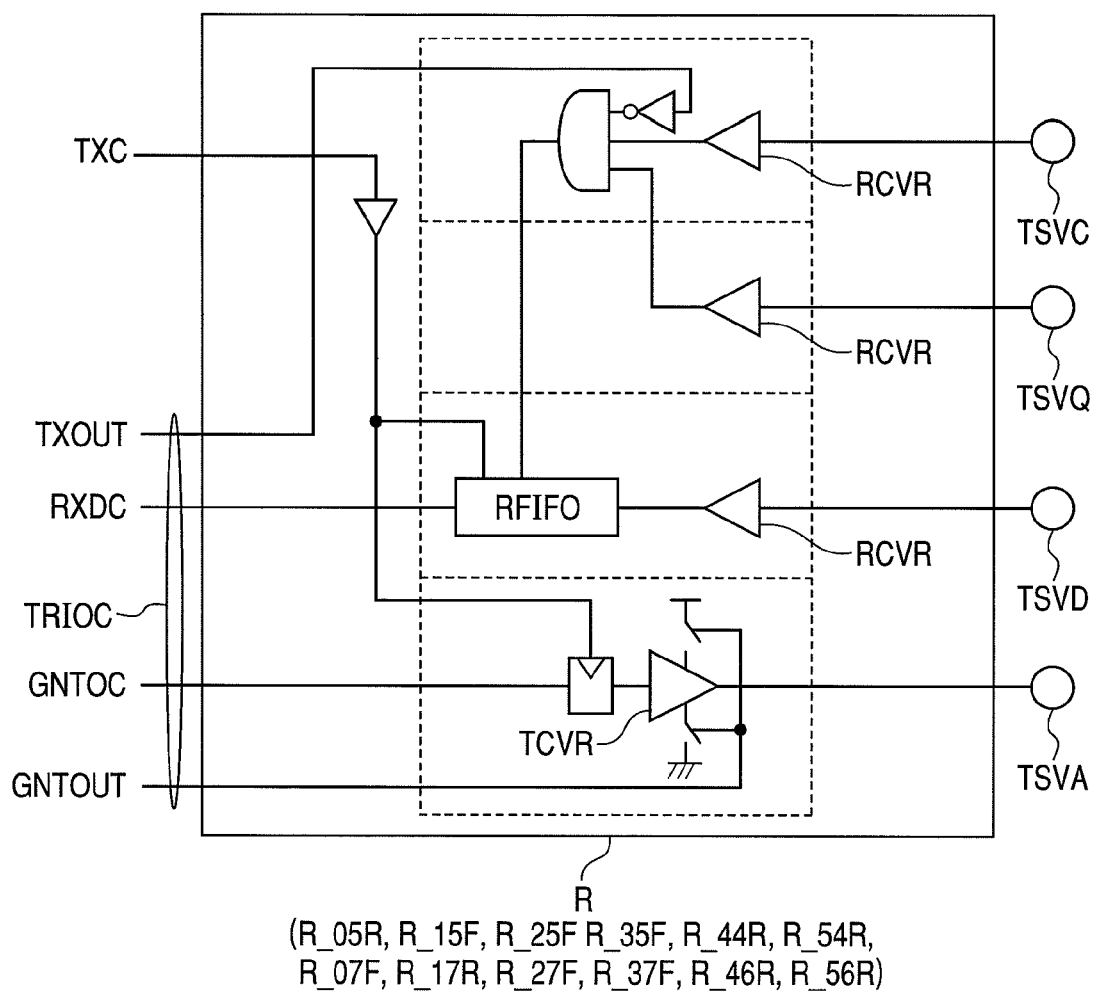
FIG. 11 is a view showing a configuration of a penetration-electrode receive-circuit shown in FIG. 1 by way of example.

FIG. 11 is a view showing a configuration of the penetration-electrode receive-circuit shown in FIG. 1 by way of example. FIG. 11 shows the configuration of the penetration-electrode transmit/receive circuit (TR) shown in the FIG. 3, after removal of a signal-transmit portion thereof. TSVD is the penetration-electrode port for receiving information such as a command, an address, data, and so forth, outputted by the penetration-electrode transmit-circuit, and when the penetration-electrode port (signal) TSVQ is asserted, the information is fetched to RFIFO at timing designated by a trigger signal inputted from the penetration-electrode port TSVC. TSVA is the signal showing whether or not the LSI at the receiving end can receive the information transmitted via TSVD. In the receive-circuit shown in FIG. 11, a signal is outputted from TSVA when GNTOUT is at "1". Further, in the case of setting where transmit is not executed (that is, in the cases of R_07F, and so forth, in FIG. 1), a TXOUT signal is fixed at '0' all the time. By so doing, the information from TSVD is not fetched to RFIFO, so that any extra operation can be checked.

Figure 4:
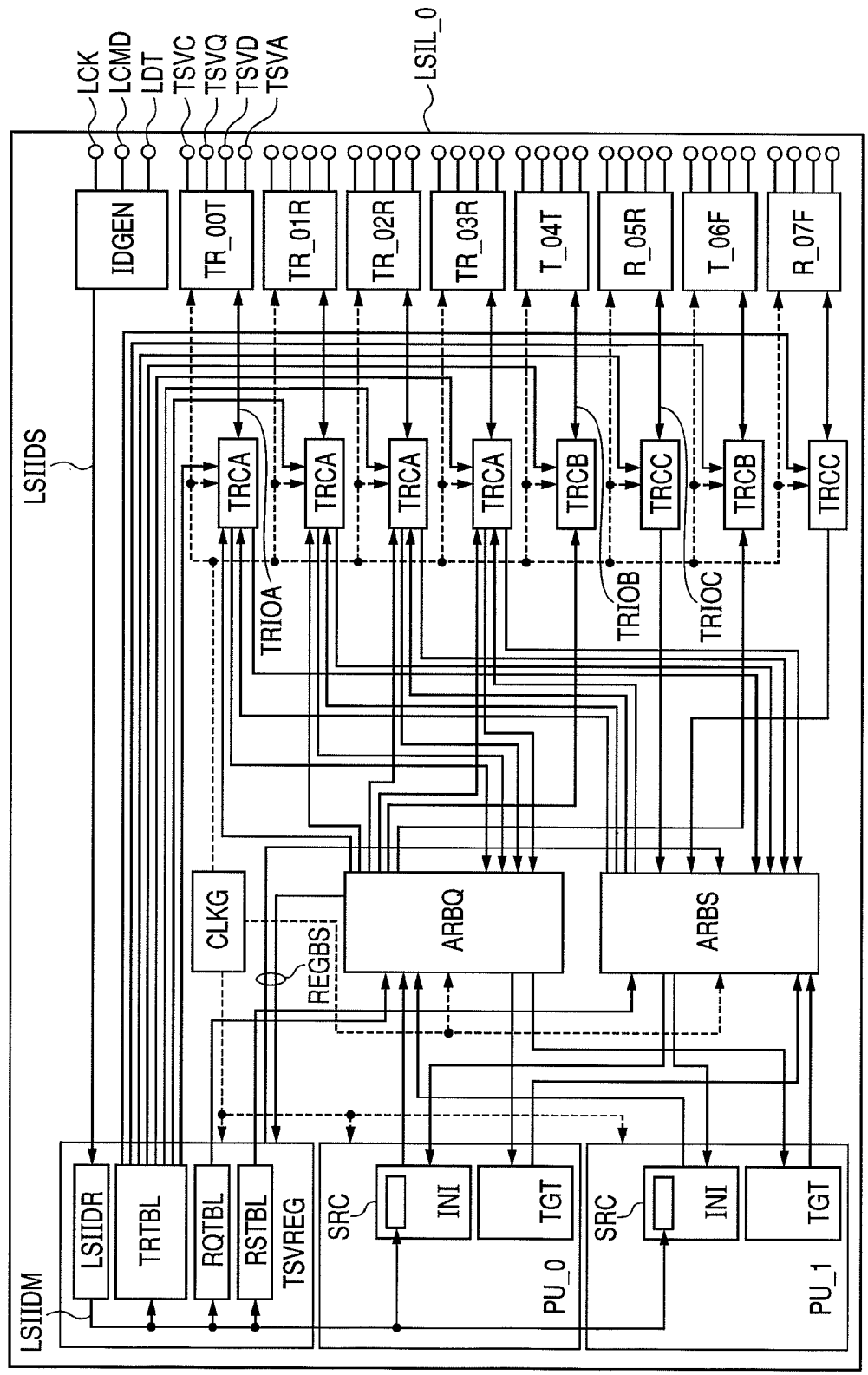
FIG. 4 is a view showing one example of a configuration of a logic LSI in FIG. 1.

FIG. 4 shows a configuration of the logic LSI (LSIL_0) in FIG. 1 by way of example. Portions of the logic LSI, excluding TR_00T, TR_01R, TR_02R, TR_03R, T_04T, R_05R, T_06F, and R_07F, shown in FIG. 4, and the penetration-electrode ports, are included in FUNC_0 in FIG. 1. PU_0, and PU_1 each denote a processor circuit such as a CPU, and so forth, INI in the processor circuit denotes a request-processing block for issuing an access-request to other circuits, including a read-request, to thereby receive a response thereto, and conversely, TGT denotes a response-processing block for receiving the access-request from other circuits, thereby responding thereto.

TRCA denotes a circuit for controlling the penetration-electrode transmit/receive circuit (TR), TRCB a circuit for controlling the penetration-electrode transmit-circuit (T), and TRCC a circuit for controlling the penetration-electrode receive-circuit (R). ARBQ, and ARBS each denote a routing-switch circuit for establishing communication among those circuits. ARBQ, and ARBS each have a role for determining a destination circuit on the basis of destination-information contained in communication information among those circuits to thereby transmit the communication information to a target circuit (routing function). ARBQ executes routing of a request from a circuit to another circuit, such as a read-request, and so forth, and ARBS executes routing of a reply to the request (for example, readout-data). TSVREG denotes a programmable memory circuit (a register for various setting) holding various set information containing information, and so forth, for use in routing. Besides, CLKG denotes a clock-feed circuit for feeding a clock to a circuit to be mounted, and IDGEN denotes an identifier-generation circuit for generating identifiers for use in distinguishing between LSIs at the time of piling up identical LSIs.

With the embodiment shown in FIG. 1, a plurality of identical LSIs are stacked one another. In this case, in order to realize a connection topology wherein a circuit for executing one transmission, and a circuit for executing a plurality of receptions are connected to the one penetration-electrode group described in the foregoing, it is necessary to be able to designate whether the penetration-electrode ports at identical positions on the respective LSIs are for use in transmission, or for use in reception on a LSI-by-LSI basis after manufacturing. In addition, it is necessary to be able to designate routing information on the penetration-electrode ports at the identical positions on the respective LSIs on the LSI-by-LSI basis after manufacturing. TSVREG includes register circuits for storing information for designating those described as above, and is described in detail hereinafter.

TRTBL is a penetration-electrode transmit/receive setting register for designating whether the penetration-electrode port is for use in transmission, or for use in reception against the penetration-electrode transmit/receive circuit, and for storing information designating whether or not the penetration-electrode transmit-circuit, and the penetration-electrode receive-circuit are set to a state enabling transmission from the penetration-electrode port, and a state enabling reception to the penetration-electrode port, respectively. With the example shown in FIG. 4, designation of TR_00T for use in transmission, designation of TR_01R, TR_02R, and TR_03R, for use in transmission, designation to set T_04T, and R_05R to a state enabling transmission, and reception, respectively, and designation to set T_06F, and R_07F to a state preventing transmission, and reception, respectively, are stored in TRTBL. With the penetration-electrode transmit/receive circuit, the TXOUT signal in FIG. 3 is controlled on the basis of such information. As shown in FIG. 8, TRTBL includes registers for designating transmit/receive for every TRCA, and registers for designating a transmit state/a receive state for every TRCB and TRCC.

RQTBL is a register for storing routing information for designating a transmit-destination of access-request communication information (access-request such as a read-request) against the switch circuit ARBQ. The access-request communication information contains a command, a destination-address, data, and an access-source-circuit identification information, and ARBQ executes routing on the basis of the destination-address. The access-source-circuit identification information (referring to, for example, PU_0) is for use in routing of response information against the access-request to thereby deliver the response information to an access-source-circuit. SRC in PU_0 as well as PU_1 is a memory element for storing the access-source-circuit identification information. A portion of a value of the SRC is generated on the basis of a value of LSIIDR to be described later in the present description, and even if LSIs of the same type are stacked, respective circuits can be provided with identification information units differing from each other, so that it is possible to effect routing of the response information even when the LSIs of the same type are stacked.

To go into more detail, RQTBL is a table for use in designating which communication information within a destination address range is to be transmitted to which circuit (the penetration-electrode control circuit RCA, or TRCB) connected to ARBQ, or either PU_0 or PU_1. As shown by RQTBL in FIG. 8, RQTBL includes registers for designating a destination address range against every TRCA, every TRCB, PU_0 and PU_1. With the respective registers, a plurality of address ranges can be designated. For example, with the embodiment shown in FIG. 1, when an access is made from the processor circuit PU_0 within FUNC_0 to a resource within circuit FUNC_3, ARBQ in LSIL_0 must transfer a request from PU_0 to TR_00T, but when an access is made from the processor circuit PU_0 within FUNC_1 to the resource within circuit FUNC_3, ARBQ in LSIL_1 transfer the request from PU_0 to TR_11T. Those requests each have the same destination address, however, respective ARBQs of the LSIs need to transfer information to the penetration-electrode ports on the LSIs, differing from each other.

In order to realize the above, ARBQ has a mechanism capable of designating information about which access-request communication information having a destination address in a specific address range may be transmitted to which circuit (TRCA, TRCB, PU_0 and PU_1), that is, (information about which penetration-electrode group may be used in order to transmit to a specific destination address) on the basis of a value of RQTBL. For example, an address range for routing to a specific TRCA is described in one of elements of RQTBL. In so doing, even in the case of a configuration wherein the identical LSIs are stacked, it is possible to realize a topology wherein one transmit-circuit, and a plurality of receive-circuits are connected to one penetration-electrode group, as shown in FIGS. 1, and 2.

RSTBL is a register for storing a routing table for response information (readout data, and so forth) against the switch circuit ARBS. With the present embodiment of the invention, the response information as destination information contains an access-source circuit identifier. RSTBL also is a register for designating information concerning to which circuit transmission of response information units having respective access-source circuit identifiers is to be executed. As shown by RSTBL in FIG. 8, RSTBL has registers designating which response information unit having a specific access-source circuit identifier is to be transmitted to respective circuits including respective TRCAs, PU_0, and PU_1. For example, combination of access-source circuit identifiers for routing to a specific TRCA is described in one of elements of RSTBL. Since the tip of the penetration-electrode port leading to a specific TRCA, or TRCC is normally connected to a plurality of circuit blocks, a plurality of the circuit identifiers can be designated for the respective registers.

LSIIDR denotes a register for storing LSI identifiers. In the case where the plurality of the identical LSIs are stacked one another, LSIIDR is required to differentiate between the LSIs. Information stored in LSIIDR is inputted from IDGEN via an LSIIDS signal. IDGEN has independent penetration-electrode ports LCK, LCMD, and LDT, for writing information on the identifiers from outside LSIs. LCK denotes a penetration-electrode port for clock, LSMD a penetration-electrode port for command, LDT a penetration-electrode port for information input/output. LDT has a structure for interconnecting an electrode on a LSI circuit plane via a plurality of flip-flop circuits connected in series thereto, and an electrode on a substrate plane. The LSI identifier is shift-inputted from the electrode on the circuit plane of LDT by use of this chain structure. LCK, and LCMD are for use in controlling a shift operation.

As a method for setting a value to TRTBL, RQTBL, and RSTBL, as above, respectively, there is available a method for adding setting-codes for those registers to a boot program of PU_0. The register setting-code reads an LSIIDR value to thereby set a value corresponding to the identifier of the LSIIDR to TRTBL, RQTBL, and RSTBL, respectively. REGBS denotes a signal line for setting a value from PU_0, and PU_1, respectively, to TSVREG in FIG. 4.

If TSVREG is provided as above, it is possible to form a freely-stacked topology even in the case of stacked layers of the identical LSIs. Further, the connection topology of the stacked LSIs can be varied according to a finished product, thereby enhancing general versatility. Furthermore, with the use of such a structure, it is possible to realize a connection topology without the use of a faulty penetration-electrode group, having an effect of enhancement in yield.

Further, as the method for setting a value to TRTBL, RQTBL, and RSTBL, respectively, there is available another method for automatic setting from a circuitry standpoint on the basis of an LSIIDR value. LSIIDM in FIG. 4 denotes a signal line provided for this purpose. While this method has a advantage in that the boot program does not require the register setting-code, flexibility will be lower.

Now, operation of the logic LSI having the configuration shown in FIG. 4 is briefly described as follows. For example, a case is assumed where PU_0 (refer to FIG. 4) of LSIL_0 in FIG. 1 issues a request to PU_0 of LSIL_1 via TR_00T, and PU_0 of LSIL_0 receives a response corresponding to the request via TR_01R. In this case, first, INI in PU_0 of LSIL_0 outputs the request containing the logic LSI's own identifier (SRC), and a destination address (expressing PU_0 of LSIL_1) to ARBQ. ARBQ executes routing corresponding to the destination address on the basis of RQTBL, and as a result, the request is transmitted to TR_00T via TRCA.

Subsequently, LSIL_1 receives the request from TR_10R, transmitting the same to ARBQ via the relevant TRCA. ARBQ executes routing corresponding to the destination address on the basis of RQTBL, and as a result, the request is transmitted to TGT of PU_0. Thereafter, predetermined processing by PU_0 is executed, and subsequently, TGT extracts the identifier contained in the request, issuing a response containing the identifier to ARBS. ARBS executes routing corresponding to the identifier on the basis of RSTBL, and as a result, the response is transmitted to TR_11T via TRCA. Subsequently, LSIL_0 receives the response from TR_01R, transmitting the same to ARBS via the relevant TRCA. ARBS executes routing corresponding to the identifier on the basis of RSTBL, and as a result, the response is transmitted to INI of PU_0.

Due to such an operation as described above, INI in PU_0 of LSIL_0 outputs the request, thereby receiving the response thereto. On the other hand, TGT in PU_0 of LSIL_1 receives the response, thereby issuing the response thereto. Accordingly, in PU_0s of the respective LSIs, INI and TGT each will be independently operable, and by so doing, higher processing efficiency can be realized, so that communication low in latency, and high in throughput can be established between the respective LSIs.

Figure 5:
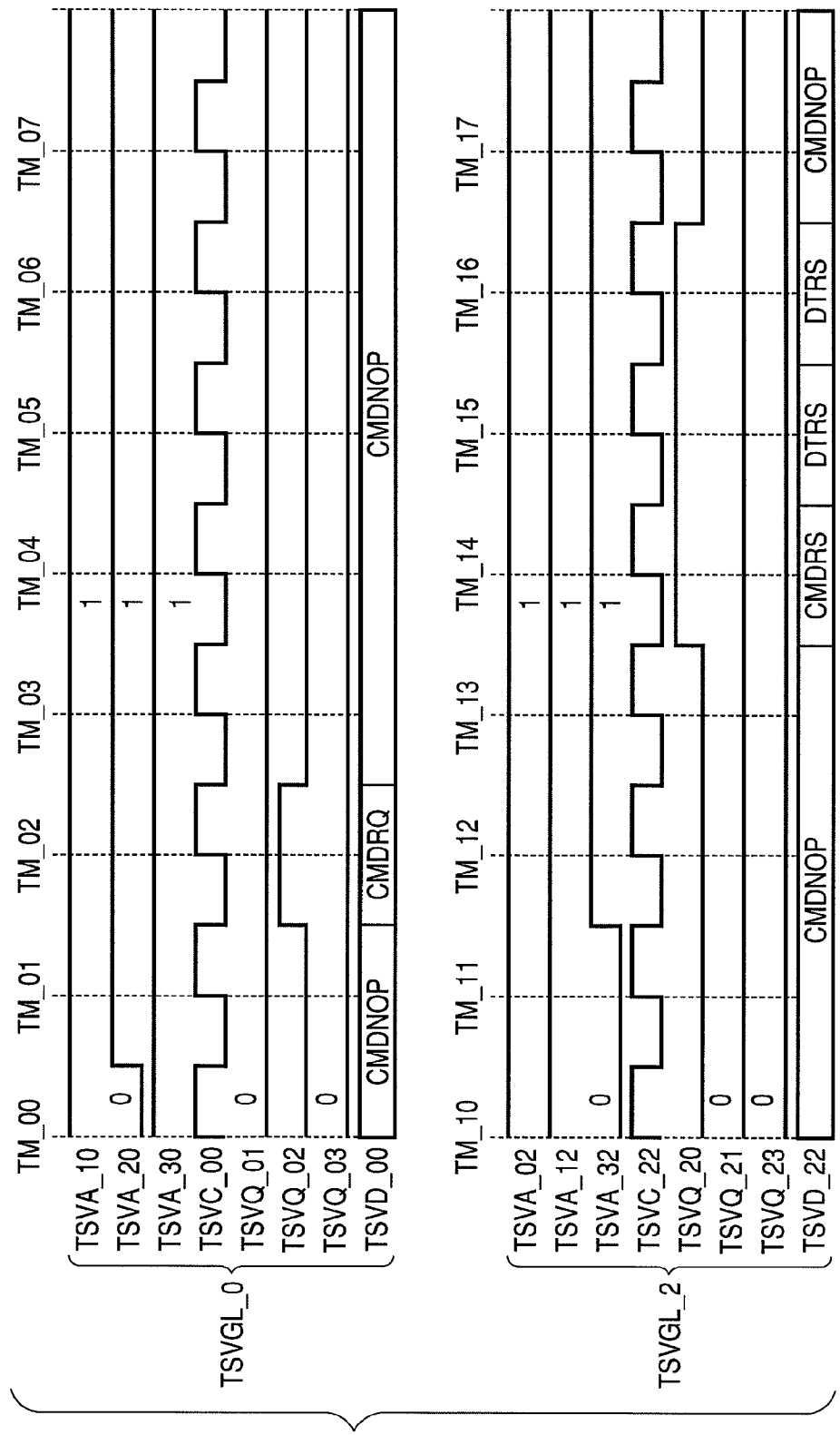
FIG. 5 is a view showing one example of a timing chart in communication using penetration-electrode, groups, as in FIGS. 1 and 3.

FIG. 5 shows time-dependent change in respective signals on the penetration-electrode ports in FIG. 3 by taking an example where the circuit PU_0 inside FUNC_0 of LSIL_0 shown in FIG. 1 executes reading into FUNC_2 of LSIL_2 through the intermediary of TSVGL_0. In FIG. 5, the horizontal axis represents time. An upper time chart relates to signals of TSVGL_0, and a lower time chart relates to signals of TSVGL_2 In FIG. 5, a read-request is outputted from LSIL_0 to TSVGL_0, and a read-result is outputted from LSIL_2 to TSVGL_2.

Issuing of a read-request is described hereinafter. TSVA_10 denotes a signal (refer to TSVA in FIG. 3) indicating a receive-enable state for access to LSIL_1 via TSVGL_0, TSVA_20 a signal (refer to TSVA in FIG. 3) indicating a receive-enable state for access to LSIL_2 via TSVGL_0, and TSVA_30 a signal (refer to TSVA in FIG. 3) indicating a receive-enable state for access to LSIL_3 via TSVGL_0. Further, TSVD_00 denotes information transmitted by LSIL_0 (corresponding to TSVD in FIG. 3), and TSVC_00 denotes a clock transmitted by LSIL_0 (corresponding to TSVC in FIG. 3). Still further, TSVQ_01 denotes a signal outputted from LSIL_0, the signal indicating that there exists an access request to the receive-circuit of LSIL_1 via TSVGL_0, TSVQ_02 a signal outputted from LSIL_0, the signal indicating that there exists an access request to the receive-circuit of LSIL_2 via TSVGL_0, and TSVQ_03 a signal outputted from LSIL_0, the signal indicating that there exists an access request to the receive-circuit of LSIL_3 via TSVGL_0.

With the example shown in FIG. 5, LSIL_0 detects that TSVA_20 is turned "1" indicating LSIL_2 in the receive-enable state, subsequently issuing a read-request CMDRQ to TSVD_00 (timing TM_02 in FIG. 5). Concurrently with the issuing of the read-request, the signal TSVQ_02 is asserted. CMDRQ contains information directing an LSI at an access destination (in this case, LSIL_2), an access destination address, and the access-source-circuit identification information (information indicating PU_0 of LSIL_0, for use as the destination information upon sending the read-result back to PU_0). Further, in the figure, CMDNOP has information indicating that an effective command has not been issued.

Issuing of a read-result is described hereinafter. TSVA_02 denotes a signal (refer to TSVA in FIG. 3) indicating a receive-enable state for access to LSIL_0 via TSVGL_2, the signal being one outputted by LSIL_0. TSVA_12 denotes a signal (refer to TSVA in FIG. 3) indicating a receive-enable state for access to LSIL_1 via TSVGL_2, the signal being one outputted by LSIL_1. TSVA_32 denotes a signal (refer to TSVA in FIG. 3) indicating a receive-enable state for access to LSIL_3 via TSVGL_2, the signal being one outputted by LSIL_3. TSVQ_20 denotes a signal outputted from LSIL_2, the signal indicating that there exists an access request to the receive-circuit of LSIL_0 via TSVGL_2, TSVQ_21 a signal outputted from LSIL_2, the signal indicating that there exists an access request to the receive-circuit of LSIL_1 via TSVGL_2, and TSVQ_23 a signal outputted from LSIL_2, the signal indicating that there exists an access request to the receive-circuit of LSIL_3 via TSVGL_2. TSVD_22 denotes information transmitted by LSIL_2 (corresponding to TSVD in FIG. 3), and TSVC_22 denotes a clock transmitted by LSIL_2 (corresponding to TSVC in FIG. 3).

With the example shown in FIG. 5, LSIL_2 acquires a read-result against the read-request CMDRQ, detecting that TSVA_02 is turned "1" indicating LSIL_0 in the receive-enable state, and issues thereafter the read-result to TSVD_22. The read-result is composed of one-cycle CMDRS, two-cycle DTRS. CMDRS indicates the read-result against the read-request CMDRQ, containing information directing the LSI at the access destination (in this case, LSIL_0), and information indicating a transmit-destination (the same as the access-source-circuit identification information in CMDRQ). Further, in the figure, CMDNOP has information indicating that an effective command has not been issued. Still further, concurrently with issuing of CMDRS, and DTRS, the signal TSVQ_20 is asserted, posting a receive-circuit that effective information is outputted to TSVD_22.

Since the signals (TSVA) indicating the receive-enable state are provided, as shown in FIGS. 3, and 5, access at a transmitting end can be stopped before a receive-buffer at a receiving end is filled to a brim. Such a mechanism as described has effects of not only preventing overflow from occurring to the receive-buffer at the receiving end but also reducing a receive-buffer capacity. As a form whereby the receive-enable state is similarly posted to the transmitting end, there is also available a method for posting to the transmitting end as one of command information from a receive-circuit to a transmit-circuit (in FIG. 5, command information on TSVD_22). In this case, there are available a method whereby a command for temporarily stopping/resuming transmission to a specific receive-circuit is mounted and a method whereby a command for posting the number of receivable data blocks of a specific receive-circuit is mounted. Those methods have a drawback in that TSVD is consumed for some period of time, but have an advantage in that the same effect as that for the exclusive signal line (TSVA) can be gained, thereby eliminating the need for an exclusive line.

Figure 6:
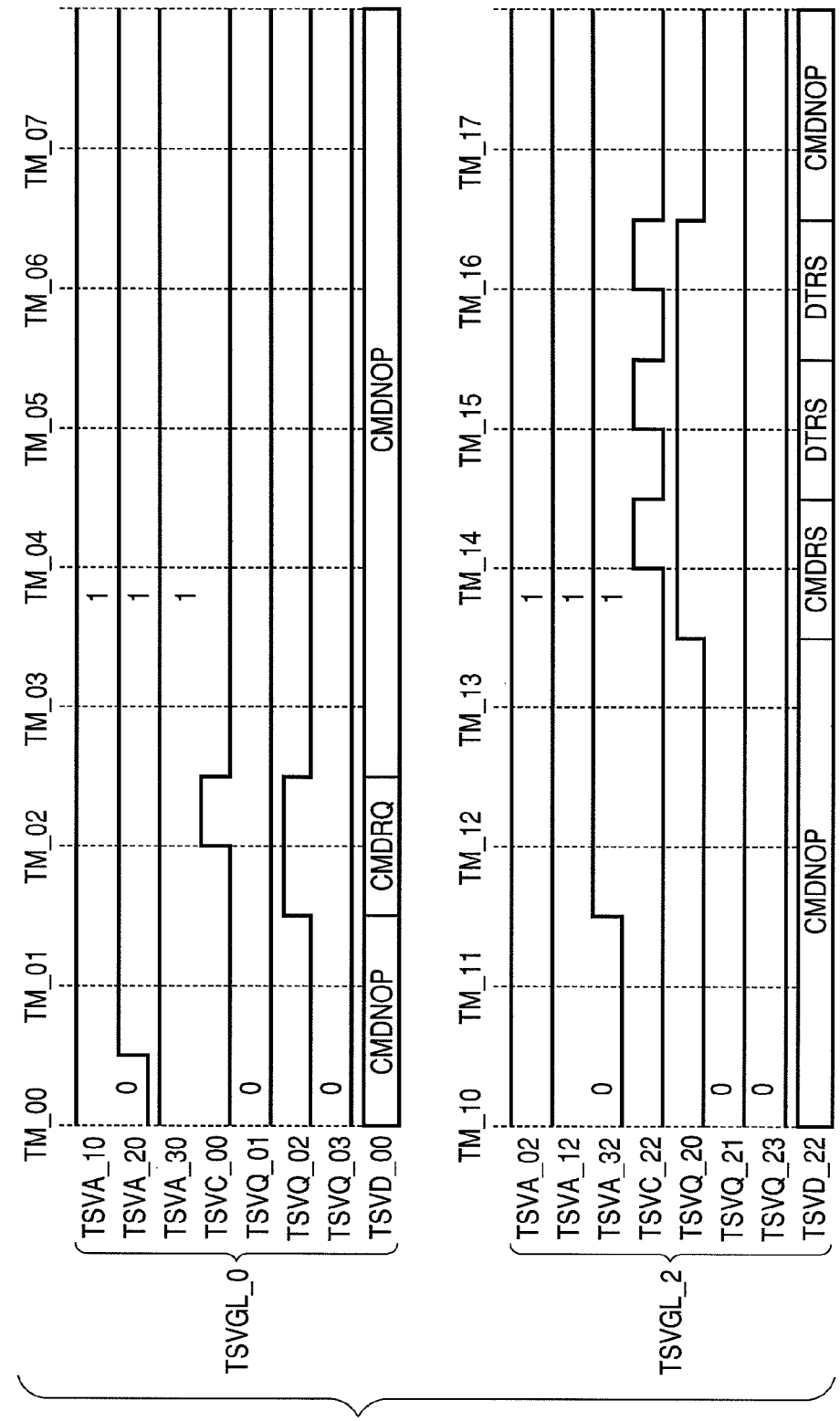
FIG. 6 is a view showing one example of another timing chart in communication using penetration-electrode groups, as in FIGS. 1 and 3.

FIG. 6 shows time-dependent change in respective signals on the penetration-electrode ports in the case where the circuit inside FUNC_0 of LSIL_0 executes reading into FUNC_2 of LSIL_2 through the intermediary of TSVGL_0, as in the case shown in FIG. 5. FIG. 6 differs from FIG. 5 only in respect of operations of TSVC_00 and TSVC_22. In contrast to the case of the example show in FIG. 5, a clock signal is transmitted to those penetration-electrode ports, a pulse signal is impressed thereon only when effective information is transmitted to TSVD_00, and TSVD_22 in the case of the example show in FIG. 6. The pulse signal indicates data-fetch timing on TSVD_00, and TSVD_22. With the method shown in FIG. 6, consumed power is rendered lower as compared with the method shown in FIG. 5.

Thus, with the use of the semiconductor apparatus according to the first embodiment of the invention, overhead time due to mediation can be checked, so that communications low in latency, and high in throughput can be established between the respective LSIs, typically in respect of the stacked LSIs.

Second Embodiment

Figure 12:
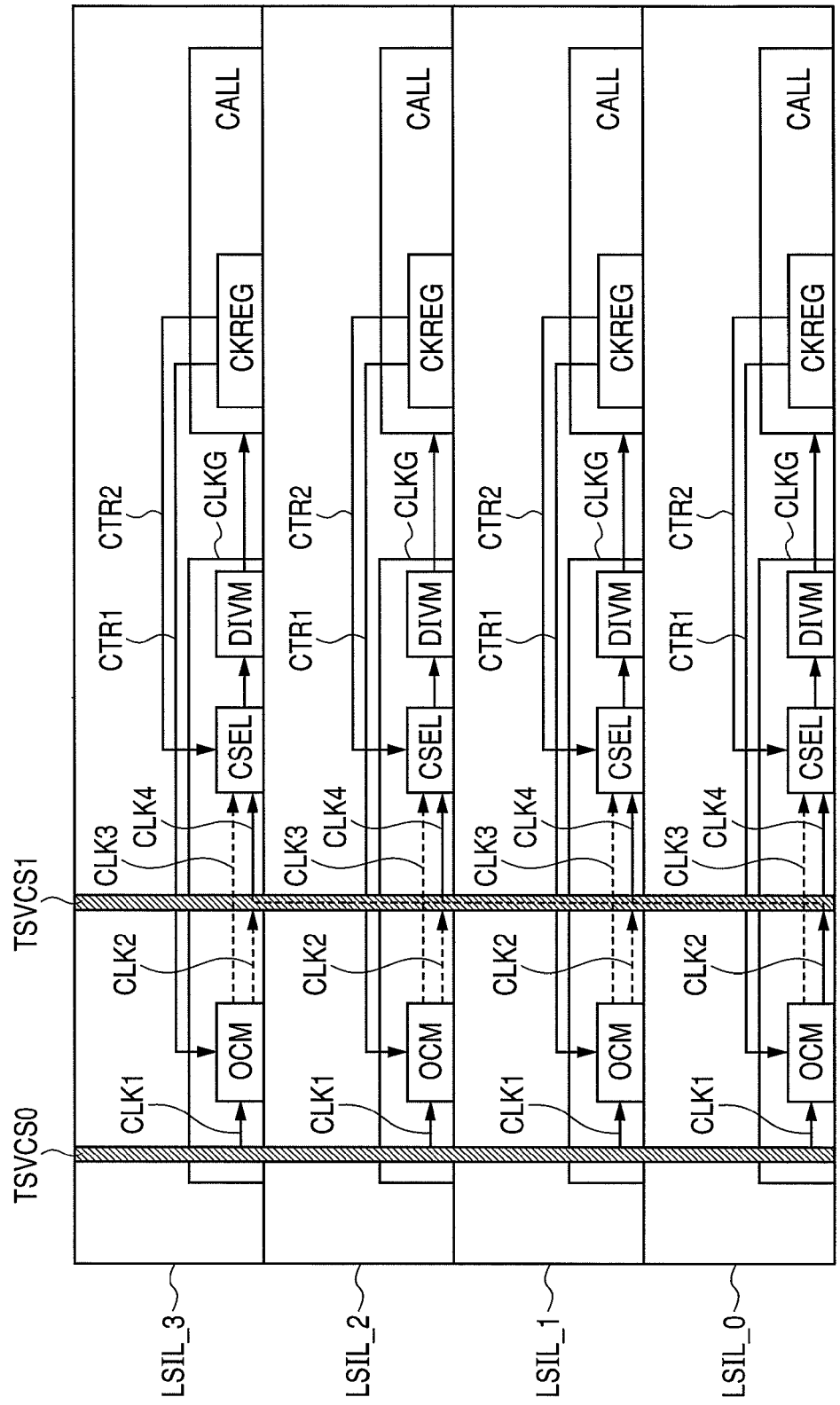
FIG. 12 is a schematic representation showing one example of a configuration of the principal part a semiconductor apparatus according to a second embodiment of the invention.

FIG. 12 is a schematic representation showing one example of a configuration of the principal part a semiconductor apparatus according to a second embodiment of the invention. In FIG. 12, with the case of the four layers of the logic LSIs (LSIL_0 to LSIL_3), shown in FIG. 1, taken by way of example, there is shown a connection form of the clock signals. CLKG denotes a clock-feeding circuit, composed of an oscillation circuit OCM, a clock-selector circuit CSEL, and a frequency divider DIVM. Call refers to all parts except CLKG, and CKREG in Call denotes a programmable memory element for controlling CLKG.

OCM is the oscillation circuit for generating an LSI internal clock on the basis of a clock inputted from outside stacked LSIs via a penetration-electrode TSVCS0. CLK3 denotes a signal line for transmitting the LSI internal clock generated by OCM to CSEL. CLK2 denotes a signal line for transmitting the LSI internal clock generated by OCM to a penetration-electrode TSVCS1, as is the case with CLK3. Output signals of OCM to CLK2, and CLK3, respectively, can be set so as not to be outputted inside OCM (high•impedance). Such setting is stored in a part of the memory element CKREG inside Call to be posted to OCM by a CTRI signal. This setting can be made after LSI activation, and the initial value thereof indicates CLK3 in a clock-output state, and CLK3 in high•impedance state.

CSEL is the circuit for selecting one clock out of two input clocks to be outputted to DIVM. One of the input clocks is a CLK3 signal outputted by OCM of the relevant LSI, and the other is a clock signal outputted by OCM of another LSI, the latter being connected to the penetration-electrode TSVCS1 via CLK4. A signal serving as a source for such selection is stored in the part of the memory element (CKREG) inside CALL to be posted to CSEL by a CTR 2 signal. Further, this setting can be made after LSI activation, and the initial value thereof indicates the CLK3 signal in as-selected state. DIVM is a circuit including a frequency-division function for executing frequency-division of a signal obtained from CSEL, thereby outputting the signal as the LSI internal clock to CALL.

With the configuration shown in FIG. 12, the clock signal generated by OCM inside LSIL_0 is in use in all the LSIs. With the adoption of the configuration described, the clock signal generated by one OCM can be utilized in a plurality of the LSIs that are stacked one another. If OCMs differing from each other on a LSI-by-LSI basis are used, this will raise a possibility that a difference in clock frequency between the LSIs will increase due to, for example, a difference in power source voltage between the LSIs. In contrast, with the use of the semiconductor apparatus according to the second embodiment of the invention, the difference in clock frequency between the LSIs differing from each other will decrease to thereby enable communication low in latency, and high in throughput to be established, and in addition, it is possible to reduce the number of stages of a buffer circuit (for example, RFIFO, in FIGS. 3, and 11) as a part of a circuit for communication between LSIs, via the penetration-electrode, thereby enabling simplification in control and reduction in circuit scale.

Thus, with the use of the semiconductor apparatus according to the second embodiment of the invention, clocks are easily synchronized between the respective LSIs typically in respect of the stacked LSIs, so that communication low in latency, and high in throughput is enabled.

Third Embodiment

Figure 7:
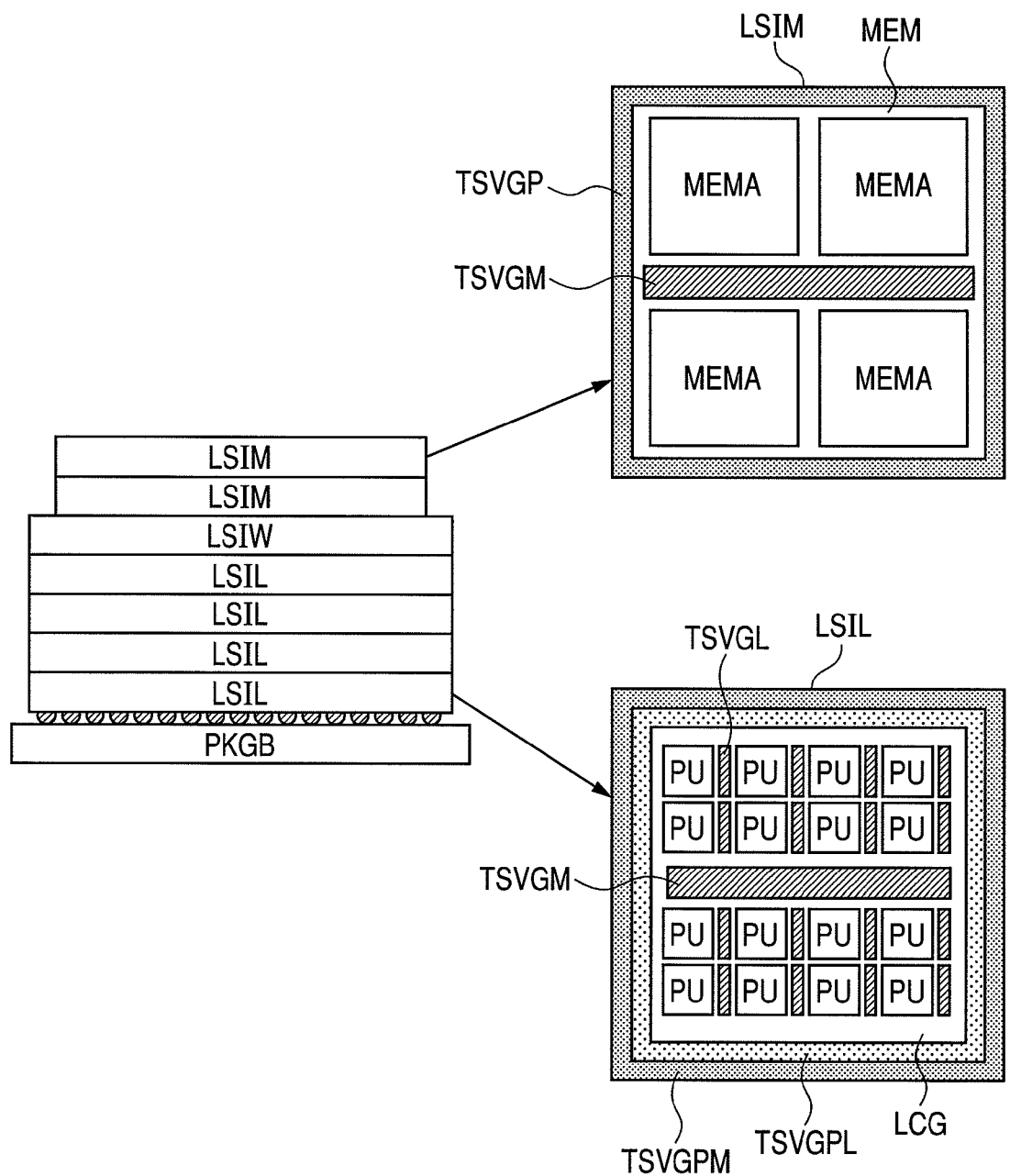
FIG. 7 is a schematic representation showing one example of a configuration of a semiconductor apparatus according to a third embodiment of the invention.

FIG. 7 is a schematic representation showing one example of a configuration of a semiconductor apparatus according to a third embodiment of the invention. In FIG. 7, the case of a stacked structure wherein a plurality of memory LSIs (LSIMs) are piled up on the plurality of the logic LSIs (LSILs), shown in FIG. 1, is taken by way of example, and there is shown an example of placements of respective penetration-electrode groups on each of LSIs. LSIW denotes an interposer LSI for aligning positions of the respective penetration-electrode groups on LSIL with positions of those on LSIM. In general, LSIL differs in size and so forth from LSIM, and it is difficult to align respective terminal positions with each other among various products. Accordingly, the respective terminal positions are altered by virtue of LSIW. By so doing, a common LSI can be used for various products, thereby enhancing flexibility in application.

In FIG. 7, TSVGL denotes the penetration-electrode group for establishing communication between the LSIs, TSVGM the penetration-electrode group for establishing communication between the logic LSI, and the memory LSI, TSVGPL the penetration-electrode group for feeding power supply and ground to the logic LSI, and TSVGPM the penetration-electrode group for feeding power supply and ground to the memory LSI in an upper layer. Further, a logic block LGC is a circuit portion of the logic LSI, other than the penetration-electrode group, LGC including a processor and so forth, and a memory block MEM is a portion of the memory LSI, other than the penetration-electrode group. LGC includes a plurality of processor circuits PU, and MEM includes a plurality of memory arrays. Further, TSVGPM is the penetration-electrode group that is not used in the logic LSI, connecting electrodes on the surface of the logic LSI to electrodes on the rear surface thereof. As a result of installation of the penetration-electrode group not connected to the LSI in the lower layer, a power supply voltage different from that for the LSI in the lower layer can be stably fed to the LSI in the upper layer. Without the installation of the penetration-electrode group, there can be available a method for feeding power supply to the LSIs in the upper layers by use of a bonding wire, however, in this case, depending on consumed power of the LSI in the upper layer, it is difficult to stably feed power supply thereto.

In the case where such a multilayer configuration is adopted, TSVGM in a band-like form is placed at the center of the LSI as one of features of placements of the penetration-electrode s for communication. Circuits such as a processor and so forth, mounted on the logic LSI, basically differs in size from memory array circuits in the memory LSI. For this reason, if TSVGMs are disposed in a dispersed fashion in the vicinity of the respective circuits, a block for the circuits in the logic LSI is required to match in size with a block for the circuits in the memory LSI, so that the configuration will be under severe constraints, thereby rendering it difficult to adopt an optimal configuration. It will be difficult to vary function/performance, memory capacity, and so forth on a product-by-product basis. Since the memory LSI, in particular, is an LSI high in flexibility, it is necessary to select a memory LSI suitable for a product's application out of a lineup of memory LSIs manufactured for general purpose, differing in capacity and performance from each other, and to enable the memory LSI as selected to be piled up on the logic LSI. Further, even if there is a change in a process for manufacturing the memory LSI, and the logic LSI, resulting in a change in circuit size, it is also necessary to be able to effect connection in the same way as before. If TSVGMs are concentrated in the central region as in the case of the present embodiment to thereby adopt a common specification, those requirements can be met Further, another feature of the placements of the penetration-electrode s lies in that TSVGLs serving as respective communication paths between the LSIs, are disposed in a dispersed fashion within LGC. With the present embodiment, the penetration-electrode groups Stags are disposed in the vicinity of respective Pus. If the communication paths are gathered together at one spot, flexibility will be enhanced as described above on one hand, but this will cause an increase in interconnection length, so that a demerit in terms of performance will often result. Such placements in the dispersed fashion as described above have advantageous effects such as lower latency in communication between the circuits of the stacked LSIs, and reduction in interconnection area. Further, in the case of communication between identical LSIs, flexibility becomes insignificant.

Further, the penetration-electrode group for power supply and grounding is disposed in an outer peripheral region of the LSI. This has an advantageous effect that flexibility is imparted to the circuits in the logic LSI, and the circuits in the memory LSI just as in the case where TSVGMs are concentrated in the central region. Even if a change occurs to, for example, the circuits mounted on the logic LSI, causing a change in circuit size, and the number of the circuits mounted, the same logic LSI as used in the past can be piled up on the memory LSI. Furthermore, the penetration-electrode group for power supply and grounding, TSVGPM, to be connected to the LSI in the upper layer (in this example, the memory LSI), is disposed on the outer side of the penetration-electrode group for power supply and grounding, TSVGPL, to be connected to the LSI in the lower layer (the LSI on a side of the semiconductor apparatus, adjacent to a package board PKGB; in this example, the logic LSI). Placement of TSVGPM on the outermost side can have an advantageous effect that the LSI in the upper layer can make effective use of a wider continuative area. Further, power supply and ground are directly connected to a functional circuit part on the plane of the LSI in the lower layer, which also has an advantageous effect of stabilization in power supply. Further, with the present embodiment, LSIL differs in size from LSIM, and placement of TSVGPM in LSIL differs from that in LSIM. For this reason, LSIW serving as the interposer LSI is inserted therebetween, thereby connecting TSVGPM in LSIL to TSVGPM in LSIM.

Still further, there is available another configuration of penetration-electrode s, wherein respective penetration-electrode s for power supply differ in diameter and pitch between the electrodes from respective penetration-electrode s for communication. This configuration is effective in terms of compatibility between stable power supply voltage, and high-speed signal transmission. In the case of the penetration-electrode for power supply, there is the need for reducing a resistance value in order to reduce a power supply voltage drop. An electrode area per unit LSI area can be increased by enlarging the diameter of the penetration-electrode to thereby reduce resistance. Further, in such a case, there will also occur an increase in electric capacity, which is preferable for power supply. On the other hand, in the case of the penetration-electrode for communication, enlargement in diameter is not preferably because an increase in electric capacity will lead to a lower transmission speed.

Thus, with the use of the semiconductor apparatus according to the third embodiment of the invention, degree of freedom (flexibility) is typically enhanced in combination of the respective LSIs in the case of the stacked LSIs. This is attained mainly by placing the penetration-electrode group in the band-like form, serving as a communication path between the logic LSI, and the memory LSI, at the center of a chip, and disposing the penetration-electrode group for a power supply system on the outer periphery of the LSI. Further, lower latency in communication can be realized by disposing the penetration-electrode s serving as the respective communication paths between the logic LSIs. Furthermore, the LSI in the lower layer is provided with the penetration-electrode group (in this case, the penetration-electrode group for power supply to the memory LSI), not connected to the LSI in the lower layer, and for use only in the LSI in the upper layer, and the penetration-electrode group described is disposed on the outer periphery of the LSI in the power layer, so that the LSI in the lower layer can make effective use of a continuative area.

Fourth Embodiment

Figure 9:
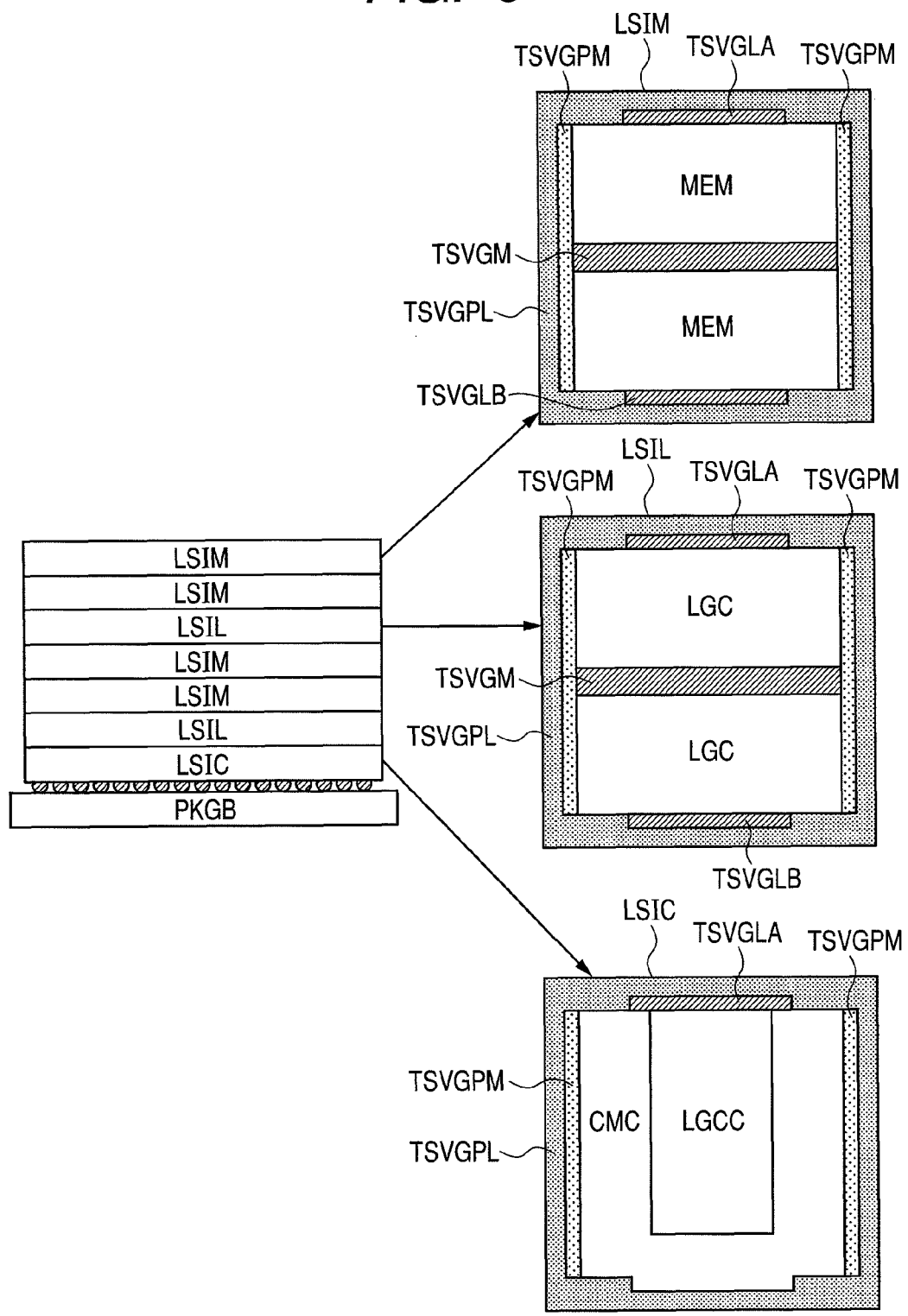
FIG. 9 is a schematic representation showing one example of a configuration of a semiconductor apparatus according to a fourth embodiment of the invention.

FIG. 9 is a schematic representation showing one example of a configuration of a semiconductor apparatus according to a fourth embodiment of the invention. In the figure, there is shown an example of placements of respective penetration-electrode groups in the case where a stacked structure differing from that shown in FIG. 7 is adopted. LSIC deposited in the lowermost layer denotes a communication LSI with a plurality of communication circuits for communication with outside LSIs, mounted thereon, LSIM a memory LSI, and LSIL a logic LSI. The circuits of stacked LSIs, for use in communication with outside the stacked LSIs, are independently provided in LSIC, so that LSIL has no need for a circuit for use in communication with outside the stacked LSIs, thereby enhancing area efficiency.

TSVGLA is a penetration-electrode group for establishing communication between the communication LSI, and the logic LSI, TSVGLB a penetration-electrode group for connection between the logic LSIs, and TSVGM a penetration-electrode group for establishing communication between the logic LSI, and the memory LSI. TSVGLA and TSVGLB each are the penetration-electrode group that is not used in the memory LSI, having a structure for connecting a surface electrode of the memory LSI to a rear surface electrode thereof without being connected to functional circuits inside the memory LSI. However, there can be a configuration wherein repeater circuits are connected together inside the memory LSI.

Thus, if the penetration-electrode groups (TSVGLA and TSVGLB, in LSIM) not used in respective LSIs in intermediate layers, and for communication between the LSIs in upper and lower layers thereof, respectively, are provided on the LSIs piled up in the intermediate layers, this will enable communication high in throughput to be established between the LSIs above, and below the penetration-electrode group, respectively.

TSVGPL is a penetration-electrode group for feeding power supply and ground to the logic LSI, and TSVGPL in the memory LSI is not used as (not connected to) an internal power supply, and ground inside the memory LSI, having a structure for connecting the surface electrode of the memory LSI to the rear surface electrode thereof. TSVGPM is a penetration-electrode group for feeding power supply and ground to the memory LSI, and TSVGPM in the logic LSI is not used as (not connected to) the internal power supply, and ground inside the memory LSI, having a structure for connecting a surface electrode of the logic LSI to a rear surface electrode thereof. CMC denotes an external communication circuits for establishing communication with outside the stacked LSIs, and LGCC denotes a penetration-electrode group in the communication LSI, and a circuit portion thereof, other than CMC. A logic block LGC is a circuit portion of the logic LSI, other than the penetration-electrode group in the logic LSI, and a memory block MEM is a circuit portion of the memory LSI, other than the penetration-electrode group in the memory LSI, such as a memory array, and so forth.

Thus, with the use of the semiconductor apparatus according to the fourth embodiment of the invention, the following effects are typically gained. More specifically, in the case of the multilayer configuration composed of LSIs of not less than three kinds, as shown in FIG. 9, and a multilayer configuration with nested LSIs, as opposed to the case of the configuration shown in FIG. 7, wherein two kinds of LSIs are sequentially connected to each other, communication is required between LSIs that are not directly opposed to each other. Accordingly, if the LSI is provided with the penetration-electrode groups for signaling, not for use inside the LSI itself, as shown in FIG. 9, this will be effective from the standpoint of high throughput. Furthermore, if not only those penetration-electrode groups for signaling but also the penetration-electrode group for power supply (for example, TSVGPL in LSIM) are disposed in the outer peripheral region of the LSI, this will increase degree of freedom in placement of the functional circuits inside the LSI.

Having specifically described the invention developed by the inventor on the basis of the embodiments of the invention as above, it is to be understood that the invention be not limited thereto, and that various changes and modification can be made in the invention without departing from the spirit and scope of the invention.

The semiconductor apparatus according to any of those embodiments described in the foregoing is useful particularly when applied to stacked LSIs wherein a plurality of logic LSI chips, a plurality of memory LSI chips, and so forth are piled up in multilayer, establishing communication therebetween via each of penetration-electrode groups. However, applicability is not limited thereto, and the semiconductor apparatus according to the invention is also applicable to respective LSI chips mounted in the stacked LSIs, as a single body.

What is claimed is:

1. A semiconductor apparatus comprising:
    first, second, and third semiconductor chips piled up one after another; and
    first, second, and third penetration-electrode groups for establishing communication among the first to the third semiconductor chips,
    wherein the first semiconductor chip transmits a request signal to the second semiconductor chip via the first penetration-electrode group, and the second semiconductor chip sends back a response signal to the first semiconductor chip via the second penetration-electrode group in response to the request signal, and
    wherein the first semiconductor chip transmits a request signal to the third semiconductor chip via the first penetration-electrode group, and the third semiconductor chip sends back a response signal to the first semiconductor chip via the third penetration-electrode group in response to the request signal.

2. The semiconductor apparatus according to claim 1,
    wherein the first semiconductor chip includes:
    a first transmit/receive circuit serving as an interface with the first penetration-electrode group;
    a second transmit/receive circuit serving as an interface with the second penetration-electrode group;
    a third transmit/receive circuit serving as an interface with the third penetration-electrode group; and
    a first transmit/receive setting unit for executing setting to the first, second, and third transmit/receive circuits, respectively;
    wherein the second semiconductor chip includes:

a fourth transmit/receive circuit serving as an interface with the first penetration-electrode group;
a fifth transmit/receive circuit serving as an interface with the second penetration-electrode group;
a sixth transmit/receive circuit serving as an interface with the third penetration-electrode group; and
a second transmit/receive setting unit for executing setting to the fourth, fifth, and sixth transmit/receive circuits, respectively; and
wherein the third semiconductor chip includes:
a seventh transmit/receive circuit serving as an interface with the first penetration-electrode group;
a eighth transmit/receive circuit serving as an interface with the second penetration-electrode group;
a ninth transmit/receive circuit serving as an interface with the third penetration-electrode group; and
a third transmit/receive setting unit for executing setting to the seventh, eighth, and ninth transmit/receive circuits, respectively; and
wherein the first transmit/receive setting unit setting the first transmit/receive circuit as a dedicated transmit circuit, the second transmit/receive circuit as a dedicated receive circuit, and the third transmit/receive circuit as a dedicated receive circuit, respectively,
wherein the second transmit/receive setting unit setting the fourth transmit/receive circuit as a dedicated receive circuit, the fifth transmit/receive circuit as a dedicated transmit circuit, and the sixth transmit/receive circuit as a dedicated receive circuit, respectively, and
wherein the third transmit/receive setting unit setting the seventh transmit/receive circuit as a dedicated receive circuit, the eighth transmit/receive circuit as a dedicated receive circuit, and the ninth transmit/receive circuit as a dedicated transmit circuit, respectively.

3. The semiconductor apparatus according to claim 2, wherein the first, second, and third transmit/receive setting units each are realized by use of a programmable memory element.

4. The semiconductor apparatus according to claim 2, wherein the first semiconductor chip further includes:
a first processing block with a first identifier assigned thereto, and a first path-setting unit;
wherein the second semiconductor chip further includes:
a second processing block with a first address assigned thereto, and a second path setting unit; and
wherein the third semiconductor chip further includes:
a third processing block with a second address assigned thereto, and a third path-setting unit,
wherein the request signal includes an address indicating a destination, and an identifier indicating a request source,
wherein the first path setting unit executes path setting such that the request signal from the first processing block toward the first address, and the request signal from the first processing block toward the second address are connected to the first transmit/receive circuit,
wherein the second path setting unit executes path setting such that the response signal from the second processing block toward the first identifier is connected to the fifth transmit/receive circuit, and
wherein the third path setting unit executes path setting such that the response signal from the third processing block toward the first identifier is connected to the ninth transmit/receive circuit.

5. The semiconductor apparatus according to claim 4, wherein the first, second, and third path setting units each are realized by use of a plurality of switch circuits, and a programmable memory element for setting ON/OFF of the plurality of the switch circuits.

6. The semiconductor apparatus according to claim 1, wherein the first semiconductor chip transmits a trigger signal in parallel with data signal indicating contents of a request, as the request signal, and
wherein the second semiconductor chip or the third semiconductor chip fetches the data signal therein by use of the trigger signal.

7. The semiconductor apparatus according to claim 2, wherein the first, second, and third semiconductor chips each include a processor circuit, and
wherein setting in the first, second, and third transmit/receive setting units, respectively, is executed on the basis of a program of the processor circuit.

8. The semiconductor apparatus according to claim 1, wherein the first, second, and third semiconductor chips each includes a memory element for storing a chip identifier, and
wherein the chip identifier is set to variously different values for each of the first, second, and third semiconductor chips by writing according to a shift-chain configuration via a penetration-electrode.

9. A semiconductor apparatus comprising a first semiconductor chip for use with other semiconductor chips piled up one after another thereon, the first semiconductor chip including:
first, second, and third penetration-electrode port groups;
first to third transmit/receive circuits connected to the first, second, and third penetration-electrode port groups, respectively; and
a transmit/receive setting unit for executing setting to the first, second, and third transmit/receive circuits, respectively,
wherein the transmit/receive setting unit sets the first transmit/receive circuit to a dedicated transmit circuit in order to transmit a request signal to those other semiconductor chips including second and third semiconductor chips, sets the second semiconductor chip to a dedicated receive circuit in order to receive a response to the request signal from the second semiconductor chip, and sets the third semiconductor chip to a dedicated receive circuit in order to receive a response to the request signal from the third semiconductor chip.

10. The semiconductor apparatus according to claim 9, wherein the transmit/receive setting unit is realized by use of a programmable memory element.

11. The semiconductor apparatus according to claim 9, wherein the first semiconductor chip further includes a processing block for executing a predetermined processing, and a path setting unit, and
wherein the path setting unit executes setting such that an output from the processing block is connected to the first transmit/receive circuit and executes setting such that an input from the second transmit/receive circuit and an input from the third transmit/receive circuit are connected to an input of the processing block.

12. The semiconductor apparatus according to claim 11, wherein the path setting unit is realized by use of a plurality of switch circuits, and a programmable memory element for setting ON/OFF of the plurality of the switch circuits.

13. A semiconductor apparatus comprising:
a plurality of semiconductor chips piled up one after another to be mounted therein; and a plurality of penetration-electrodes for use in establishing communication among the plurality of the semiconductor chips, wherein the plurality of the semiconductor chips each including:

a plurality of transmit/receive circuits each serving as an interface with each of the plurality of the penetration-electrodes; and a transmit/receive setting unit for setting each of the plurality of the transmit/receive circuits to a dedicated transmit circuit, or a dedicated receive circuit, wherein the transmit/receive setting unit executes setting such that one of the dedicated transmit circuits, and a plurality of the dedicated receive circuits are connected to each of the plurality of the penetration-electrodes.

14. The semiconductor apparatus according to claim 13, wherein the transmit/receive setting unit is realized by use of a programmable memory element.

15. The semiconductor apparatus according to claim 13, wherein the plurality of the semiconductor chips include first and second semiconductor chips, wherein the plurality of the penetration-electrodes include first and second penetration-electrodes, wherein the first semiconductor chip includes:

a first processing block including a first request processing circuit, and a first response processing circuit;

a first dedicated transmit circuit set by the transmit/receive setting unit, connected to a first penetration-electrode;

a first dedicated receive circuit set by the transmit/receive setting unit, connected to a second penetration-electrode; and a first path setting unit, wherein the second semiconductor chip includes:

a second processing block having a second request processing circuit, and a second response processing circuit;

a second dedicated receive circuit set by the transmit/receive setting unit, connected to the first penetration-electrode;

a second dedicated transmit circuit set by the transmit/receive setting unit, connected to the second penetration-electrode; and a second path setting unit, wherein the first path setting unit executes setting such that an output from the first request processing circuit is connected to the first dedicated transmit circuit, an input from the second response processing circuit to the first dedicated receive circuit is connected to the first request processing circuit, and an input from the second request processing circuit to the first dedicated receive circuit is connected to the first response processing circuit, and wherein the second path setting unit executes setting such that an output from the second request processing circuit is connected to the second dedicated transmit circuit, an input from the first response processing circuit to the second dedicated receive circuit is connected to the second request processing circuit, and an input from the first request processing circuit to the second dedicated receive circuit is connected to the second response processing circuit.

16. The semiconductor apparatus according to claim 15, wherein the first and second path setting units each are realized by use of a plurality of switch circuits, and a programmable memory element for setting ON/OFF of the plurality of the switch circuits.

* * * * *